United States Patent [19]
Horimai et al.

[11] Patent Number: 5,633,854
[45] Date of Patent: May 27, 1997

[54] METHODS AND APPARATUS FOR REPRODUCING DATA RECORDED ON AN OPTICAL RECORDING MEDIUM

[75] Inventors: Hideyoshi Horimai; Goro Fujita, both of Kanagawa, Japan

[73] Assignee: Sony Corporation, Japan

[21] Appl. No.: 291,612

[22] Filed: Aug. 17, 1994

Related U.S. Application Data

[62] Division of Ser. No. 133,113, filed as PCT/JP93/00205, Feb. 19, 1993.

[30] Foreign Application Priority Data

| Feb. 19, 1992 | [JP] | Japan | 4-069736 |
| May 25, 1992 | [JP] | Japan | 4-157434 |
| Jun. 18, 1992 | [JP] | Japan | 4-182847 |

[51] Int. Cl.$^6$ .................................. G11B 7/00
[52] U.S. Cl. .................... 369/124; 369/54; 369/48
[58] Field of Search ...................... 369/44.26, 111, 369/44.32, 48, 44.41, 44.42, 32, 47, 59, 124, 275.3, 275.4, 44.23, 58, 44.24, 112, 54, 44.37

[56] References Cited

U.S. PATENT DOCUMENTS

| 4,455,632 | 6/1984 | Braat | 369/124 |
| 4,646,281 | 2/1987 | Verboom | 369/59 |
| 4,831,613 | 5/1989 | Kanda | 369/124 |
| 5,084,858 | 1/1992 | Maeda | 369/44.41 |
| 5,113,386 | 5/1992 | Whitehead et al. | 369/44.41 |
| 5,121,375 | 6/1992 | Kuribayashi | 369/44.37 |
| 5,153,872 | 10/1992 | Maeda | 369/124 |
| 5,200,941 | 4/1993 | Matoba et al. | 369/44.26 |
| 5,202,870 | 4/1993 | Aoki et al. | 369/44.25 |
| 5,226,031 | 7/1993 | Abe | 369/124 |
| 5,237,556 | 8/1993 | Pierce | 369/44.42 |
| 5,268,886 | 12/1993 | Nagashima et al. | 369/44.41 |
| 5,289,443 | 2/1994 | Maeda et al. | 369/44.36 |
| 5,291,471 | 3/1994 | Russell | 369/44.26 |
| 5,355,361 | 10/1994 | Maeda | 369/58 |
| 5,361,244 | 11/1994 | Nakamura et al. | 369/44.23 |
| 5,402,403 | 3/1995 | Maeda | 369/44.32 |
| 5,438,563 | 8/1995 | Oshiba et al. | 369/120 |

FOREIGN PATENT DOCUMENTS

| 0 305 979 | 8/1989 | European Pat. Off. . |
| 0 376 626 | 4/1990 | European Pat. Off. . |
| 0 400 899 | 5/1990 | European Pat. Off. . |
| 0 402 180 | 12/1990 | European Pat. Off. . |
| 0 507 304 | 7/1992 | European Pat. Off. . |
| 0 502 582 | 9/1992 | European Pat. Off. . |
| 58-158044 | 9/1983 | Japan . |
| 59-207433 | 11/1984 | Japan . |
| 62-47828 | 3/1987 | Japan . |
| 1-134728 | 5/1989 | Japan . |
| 2-185717 | 7/1990 | Japan . |
| 3-119523 | 5/1991 | Japan . |
| 4-28016 | 1/1992 | Japan . |

*Primary Examiner*—Nabil Hindi
*Attorney, Agent, or Firm*—Limbach & Limbach L.L.P.

[57] ABSTRACT

An optical recording medium on which information data is to be recorded and on which an n-th recording track is located at a distance from the (n−1)th recording track preceding the n-th recording track in a recording region which is narrower than the diameter of a spot of a light beam radiated on the recording area, with recording data obtained on logical processing with recording data recorded on the (n−1)th recording track being recorded on the n-th recording track for increasing the storage capacity of information data, is disclosed. A return beam of a light beam radiated across two neighboring recording tracks on the optical recording medium is detected by a detector having first and second light receiving sections having a boundary line extending parallel to the recording track of the optical recording medium for reading out the information recorded on the optical recording medium based on the level of a sum or difference signal of the output signals of the first and second light receiving sections.

12 Claims, 20 Drawing Sheets

TRACKS #i-1#i

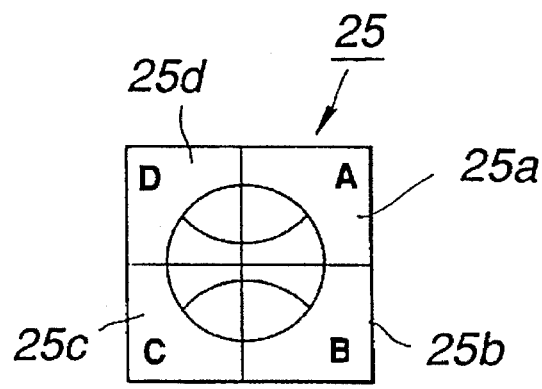
FIG.7
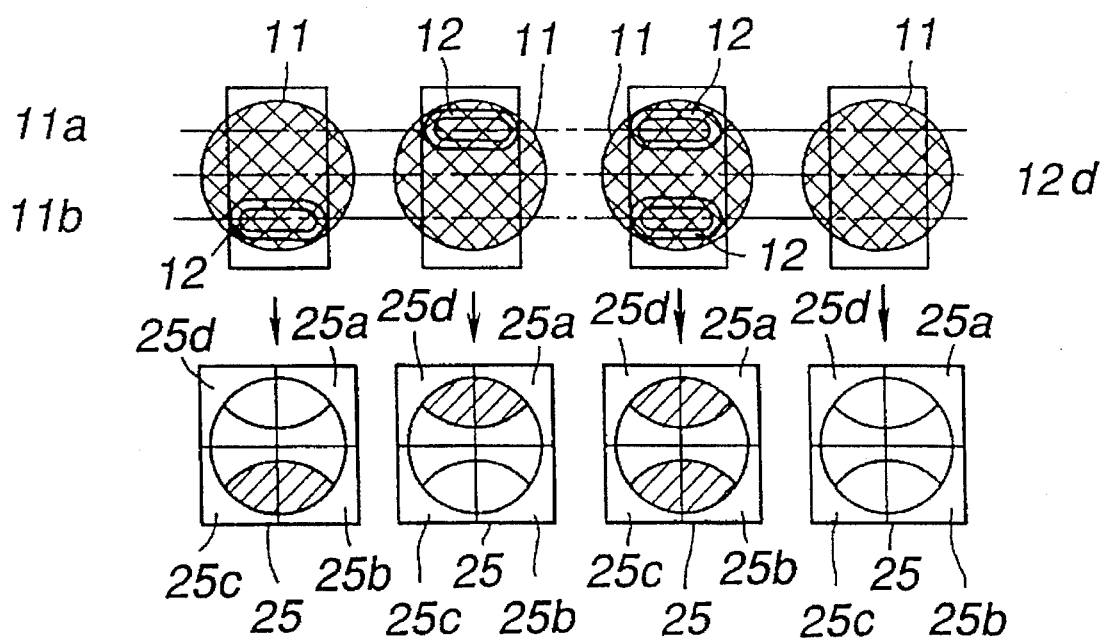
FIG. 8(a)  FIG. 8(c)
FIG. 8(b)  FIG. 8(d)

FIG. 14(a) OUTPUT OF SAMPLE-AND-HOLD CIRCUIT 115
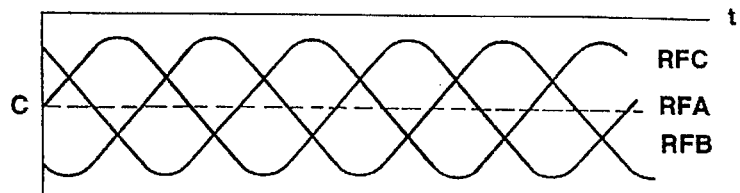
FIG. 14(b) TRACKING ERROR SIGNAL
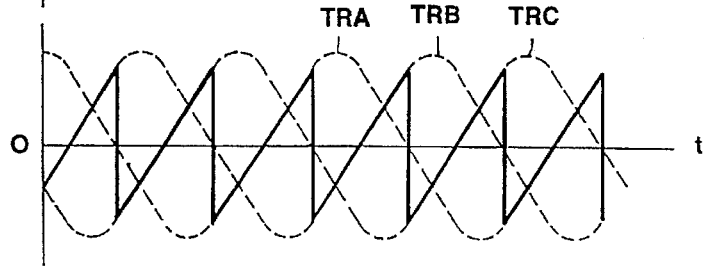
FIG. 14(c) SIGN SIGNAL PA / SIGN SIGNAL PB / SIGN SIGNAL PC
FIG. 14(d) CONTROL SIGNAL CA / CONTROL SIGNAL CB / CONTROL SIGNAL CC
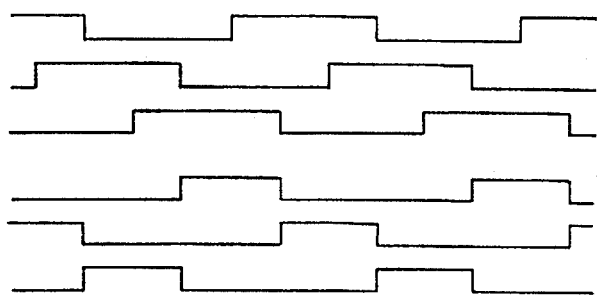
FIG. 14(e) TRACKING ERROR SIGNAL
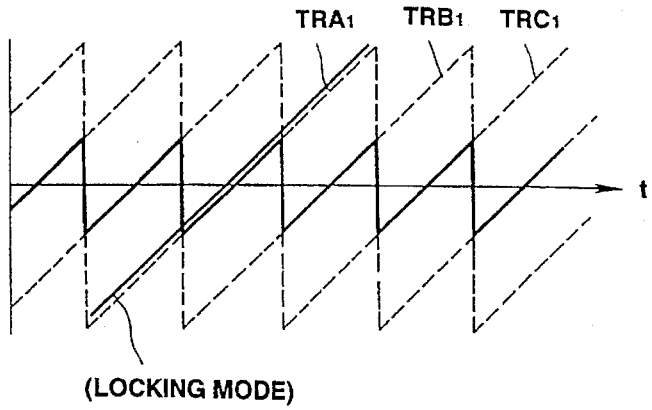
(LOCKING MODE)

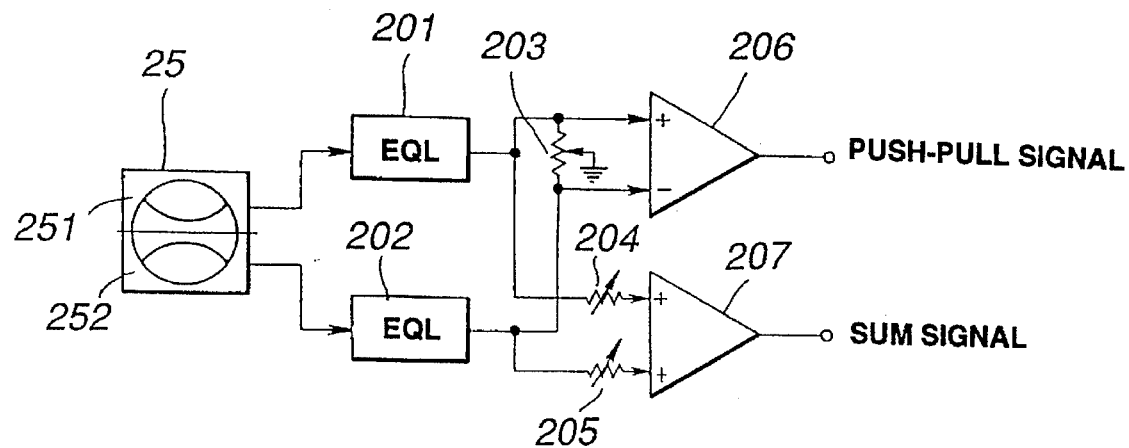
FIG.18
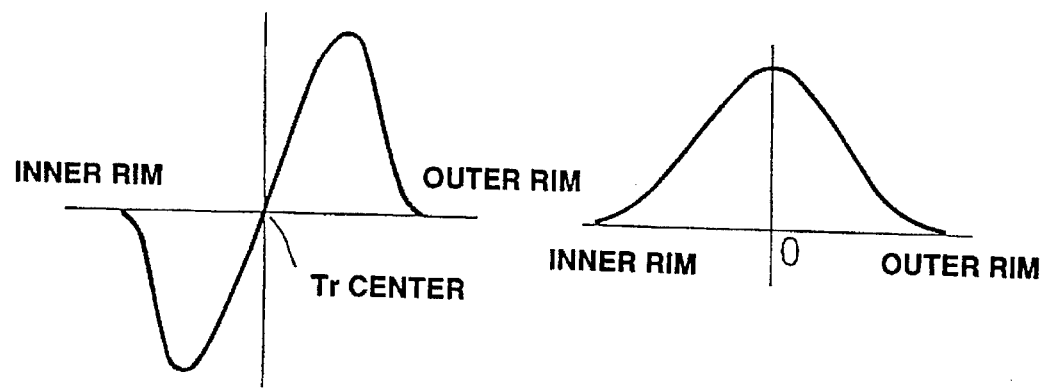
FIG. 19(a)
PUSH-PULL SIGNAL
FIG. 19(b)
SUM SIGNAL

METHODS AND APPARATUS FOR REPRODUCING DATA RECORDED ON AN OPTICAL RECORDING MEDIUM

This is a divisional of application Ser. No. 08/133,113, filed as PCT/JP93/00205, Feb. 19, 1993.

TECHNICAL FIELD

This invention relates to an optical recording medium, a method for recording and reproducing signals on and from the recording medium, and a method for generating tracking error signals. More particularly, it relates to an optical recording medium capable of high density recording, and a method for recording and reproducing information signals on and from such optical recording medium.

BACKGROUND ART

An optical recording medium, rotationally driven at a constant angular velocity (CAV), has a physical format as shown in FIG. 1, in which pits 72, each having a pit width of 0.5 μm and a pitch length of 0.86 pro, are formed at a track pitch of 1.6 μm in the radial direction, and in which the pits 72 are in an ordered array in a direction extending along the recording track.

These dimensions are based on manufacture constraints and on the diameter of a beam spot 71 on the optical recording surface of a light beam outgoing from a playback laser diode and converged by an objective lens.

For improving the recording density of the above-mentioned optical disc, it may be contemplated to diminish the track pitch, pit length and the spot size of the light beam on the recording surface.

In the case of e.g. a magneto-optical disc., constraints are imposed that pits recorded on the basis of a given accessing unit be independent from the pits recorded on the basis of other accessing units, and that all data based on the accessing units have to be rewritten. However, for achieving high density, the spot scanning rate is lowered, with the spot size of the light beam remaining unchanged, and a pit next to be formed is formed in superimposition on a part of the previously formed pit by way of overwriting for effectively reducing the pit length. That is, the recording density is increased in the track direction for achieving a magneto-optical disc having a recording density higher than that of a so-called compact disc as a read-only optical disc having the same diameter as the magneto-optical disc.

It may also be envisaged to narrow the track pitch for increasing the recording density in the radial direction of the optical disc. If the spot size on the recording surface of the light beam should remain unchanged, a light beam is radiated on pits of a neighboring recording track. The result is a cross-talk and a lower S/N ratio and, in the worst case, data can not be reproduced.

It may be contemplated to narrow the track pitch and to reduce the spot size of the light beam on the recording surface simultaneously. However, since the spot size of the light beam on the recording surface is proportionate to the wavelength of the light beam and inversely proportionate to the numerical aperture NA of an objective lens, it becomes necessary to develop a laser light source of a shorter wavelength or a large-sized expensive lens with a view to increasing the numerical aperture NA.

It may also be envisaged to keep the spot size of the light beam unchanged as before and to narrow the track pitch as well as to narrow the pit width to inhibit cross-talk to raise the recording density. However, if the pit width is reduced, the production yield of the optical disc tends to be lowered, while it becomes impossible to employ a customary cutting device.

Besides, when recording or reproducing the information on and from the optical recording medium, such as an optical disc, it becomes necessary to effect tracking control to cause the light beam to scan the track center at all times.

For tracking control, there is known a sample servo system in addition to a continuous servo in which tracking control is performed using a pre-groove formed on a disc substrate of the optical disc. Tracking control in the sample servo system is effected with the aid of a pair of wobble pits 51a, 51b pre-formed on the optical disc with a shift of one-fourth of a track pitch in mutually opposite directions from the center of the recording track formed on the disc, that is the track center, as shown in FIG. 2.

Specifically, a tracking error signal is found based on a difference between the signals derived from sampling of the amount of the reflected light produced when the spot 53 of the light beam traverses the wobble pits 51a, 51b. Tracking control is effected by radially shifting the spot 53 so that the tracking error signal becomes equal to "0".

On the other hand, track jump for shifting the light beam spot to a neighboring track or a separate recording track for recording the information or reproducing the information on or from such neighboring or separate track is performed in the following manner. First, a tracking control loop is once opened and the light spot is moved to the vicinity of the target track. The tracking control loop is again closed to effect tracking control again to shift the spot to the target track.

During the above-mentioned track jump, that is when the light beam spot is scanned obliquely across the recording track of the optical disc, the tracking error signal in the sample servo system becomes a sine wave signal as shown in FIG. 3 so that the tracking error signal is not defined monistically with respect to the displacement x of the light spot from the center of the recording track. It is within a range 61 indicated by hatching lines in FIG. 3 that the tracking error signal is defined monistically with respect to the displacement x. That is, it is only when the light spot is within the range 61 shown in FIG. 3 that the light beam spot may be moved stably to the center of the recording track.

On the other hand, if the displacement x is larger so that the beam spot is outside the range 61 shown in FIG. 3, tracking control becomes unstable or in a state of oscillation. Such situation tends to be incurred in case of a larger relative movement velocity of the light bream spot along the radial direction of the disc. If there is an error in a distance by which the light beam spot has been moved on opening the tracking control loop during track jump, and the tracking control loop is closed outside the range 61 shown in FIG. 3, there is a risk that the light beam spot be moved to a recording track other than the target recording track. In such case, it becomes necessary to effect track jump a second time. However, such track jump cannot be undertaken until stabilization of the track control loop.

Thus the conventional tracking control system has a drawback that track jump cannot be achieve in stability.

Besides, if the track pitch is narrowed as described above for raising the recording density of the optical disc, it becomes necessary to provide wobble pits 51a, 51b offset by a distance equal to a quarter track along the radius of the disc, in the case of the sample servo system, as shown in FIG. 2, so that it has not been possible to narrow the track pitch.

In view of the above-described status of the art, it is an object of the present invention to provide an optical recording medium capable of high density recording without changing the pit width, pit length or the size of the light beam spot, and a method for recording or reproducing the information on or from such recording medium.

It is another object of the present invention to provide a recording method for an optical recording medium capable of increasing the recording density as compared to that achieved with the conventional recording method, an optical recording medium capable of high density recording, and a method for generating tracking error signals capable of achieving stabilized tracking control.

DISCLOSURE OF THE INVENTION

The present invention provides an optical recording medium wherein an n-th recording track is located at a distance from an (n−1)th recording track preceding the n-th recording track in a recording region which is narrower than the diameter of a spot of a light beam radiated on the recording area, with recording data obtained on logical processing with recording data recorded on the (n−1)th recording track being recorded on the n-th recording track.

The present invention also provides a method for reproducing an optical recording medium including receiving, with a detector having first and second light receiving areas having a boundary line extending parallel to a recording track of the optical recording medium, a return beam of a light beam radiated across two adjacent recording tracks on the optical recording medium, and reading the information recorded on the optical recording medium based on the level of a sum signal of output signals of the first light receiving section and the second light receiving section.

The present invention also provides a method for reproducing an optical recording medium including receiving, with a detector having first and second light receiving areas having a boundary line extending parallel to a recording track of the optical recording medium, a return beam of a light beam radiated across two adjacent recording tracks on the optical recording medium, and reading the information recorded on the optical recording medium based on the level of a differential signal between output signals of the first light receiving section and the second light receiving section.

The present invention also provides a method for recording an optical recording medium including recording, on a succeeding recording track of the recording medium, the results of logical processing between recording data recorded on a previous recording track and recording data recorded on the succeeding track, with the succeeding track directly succeeding the previous track.

The present invention also provides a method for generating a tracking error from an optical recording medium having first and second pits on a (n−1)th recording track in a recording region and a third pit on an n-th recording track succeeding the (n−1)th recording track, with the n-th recording track being formed at a distance from the (n−1)th recording track narrower than the diameter of a spot of a light beam radiated on the (n−1)th track, with the third pit being used for detecting the tracking error in cooperation with one of the first and second pits, comprising sample-holding a detection signal, obtained on scanning the first, second and third pits with the light beam, at timings of scanning the first, second and third pits with the light beam, taking differences between sample-held detection signals for generating plural differential signals and detecting the signs of the differential signals for periodically switching the differential signals for generating the tracking error signal.

The present invention also provides an optical recording medium wherein an n-th recording track is located at a distance from the (n−1)th recording track preceding the n-th recording track in a recording region which is narrower than the diameter of a spot of a light beam radiated on the recording area, with recording data obtained on logical processing with recording data recorded on the (n−1)th recording track being recorded on the n-th recording track. With the present optical recording medium, the storage capacity may be increased as compared to that of the conventional recording medium.

The present invention also provides a method for reproducing an optical recording medium including receiving, with a detector having first and second light receiving areas having a boundary line extending parallel to a recording track of the optical recording medium, a return beam of a light beam radiated across two adjacent recording tracks on the optical recording medium, and reading the information recorded on the optical recording medium based on the level of a sum signal or a differential signal of output signals of the first light receiving section and the second light receiving section. In this manner, an optical recording medium having an increased storage capacity may be reproduced without changing the constant of the optical system of the optical pickup of the conventional optical recording medium.

With the method for recording an optical recording medium according to the present invention, including recording, on a succeeding recording track of the recording medium, the results of logical processing between recording data recorded on a preceding recording track and recording data recorded on the succeeding track, with the succeeding track directly succeeding the preceding track, recording may be made on the optical recording medium having a high recording capacity without changing the optical system of the conventional recording apparatus.

Besides, the method of the present invention for generating a tracking error signal of an optical recording medium having first and second pits on an (n−1)th recording track in a recording region and a third pit on an n-th recording track succeeding the (n−1)th recording track, with the n-th recording track being formed at a distance from the (n−1)th recording track narrower than the diameter of a spot of a light, beam radiated on the (n−1)th track, with the third pit being used for detecting the tracking error in cooperation with one of the first and second pits, includes sample-holding a detection signal, obtained on scanning the first, second and third pits with the light beam, at timings of scanning the first, second and third pits with the light beam, taking differences between sample-held detection signals for generating plural differential signals and detecting the signs of the differential signals for periodically switching the differential signals for generating the tracking error signal, a stable tracking control operation may be achieved.

BRIEF DESCRIPTION OF THE DRAWINGS

FIG. 7 shows the constitution of a light receiving surface of a detector forming a part of the above optical disc reproducing apparatus.

FIGS. 8(a), 8(b), 8(c) and 8(d) show far field patterns of the reflected light on the light receiving surface of the detector forming a part of the optical above disc reproducing apparatus.

FIG. 18 is a circuit diagram of a reproducing circuit according to a third embodiment of the present invention.

FIGS. 19(a) and 19(b) are signal waveform diagrams showing a push-pull signal and a sum signal generated in the reproducing circuit shown in FIG. 18.

BEST MODE FOR CARRYING OUT THE INVENTION

The optical recording medium and the method for recording and reproducing signals on or from the recording medium, according to the first embodiment of the present invention, will be explained with reference to FIGS. 4 to 10.

Figure 4:
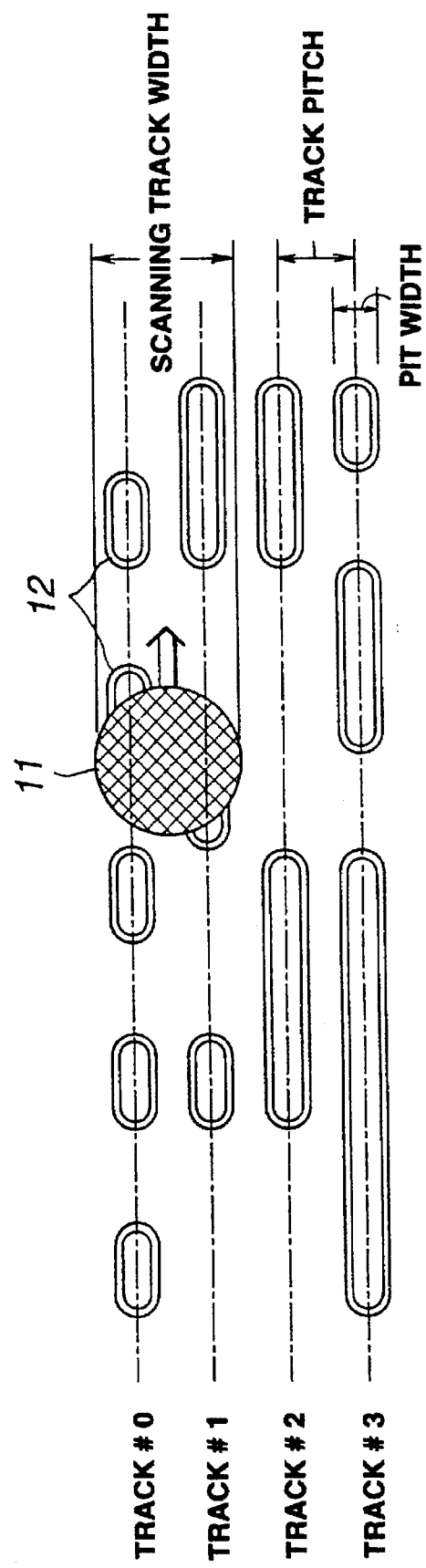
FIG. 4 shows a format of pits formed on a recording surface of an optical disc according to a first embodiment of the present invention.

The present embodiment is applicable to a read-only optical disc which is run in rotation at a constant angular velocity (CAV). FIG. 4 shows a physical format on the recording surface of the optical disc. The physical format formed on the recording surface of the optical disc is such that the track pitch is 1/n times the spot size of the replay light spot on the recording surface and an n-th recording track is formed by pits formed on the basis of data obtained by a predetermined logical processing between the data recorded on the previous (n−1)th recording track and input data.

Specifically, the diameter of a spot 11 of the replay light spot on the recording surface, that is the spot size, is selected to be equal to that employed in the compact disc reproducing apparatus, or 1.5 to 1.6 µm, while a pit 12 having a pit width and a pit diameter of 0.5 µm to 0.86 µm (=1.6/2) µm, as with the compact disc (read-only optical disc) is formed at a track pitch of 0.8 pro, which is equal to 1/n times, such as one-half, of the spot size.

These pits 12 are formed in such a manner that, when "1"s appear in succession as recording data, the pits are combined with the next following pit on the same recording track, with the pit length being then proportional to the number of successive "1"s, as shown in FIG. 4.

Besides, the pits 12 recorded on a recording track # (number) i (i=1, 2, 3, ... ) are formed on the basis of data obtained on a predetermined logical processing between the data recorded on the previous recording track #(i−1) and input data, for example, logical coincidence or equivalance of a negative logic of an exclusive OR operation,

TABLE 1

| recording track # | recording data | | | | | | | | |
|---|---|---|---|---|---|---|---|---|---|
| 0 | 1 | 0 | 1 | 0 | 1 | 0 | 1 | 0 | 1 | 0 |
| 1 | 0 | 1 | 1 | 0 | 0 | 0 | 1 | 1 | 0 |
| 2 | 1 | 1 | 1 | 0 | 0 | 1 | 1 | 1 | 1 |
| 3 | 0 | 0 | 1 | 1 | 1 | 1 | 0 | 0 | 1 |

It is now assumed that input data to the recording track #i are such that, for the recording tracks #0 #1, #2 and #3, input data are (1, 0, 1, 0, 1, 0, 1, 0, 1, 0), (0, 1, 1, 1, 0, 0, 0, 1, 1, 0), (1, 1, 1, 0, 0, 0, 1, 1, 1, 1) and (0, 0, 1, 1, 1, 0, 0, 0, 1), respectively, as shown in Table 1, and that the recording track #0 is the innermost recording track, As for the recording data for the recording track #0, since no data is recorded in the innermost recording track, that is the previous recording track, the initial value of the recording data is assumed to be "0", and input data are used directly as the recording data, as shown in Table 2.

TABLE 2

| recording track # | recording data | | | | | | | | |
|---|---|---|---|---|---|---|---|---|---|
| 0 | 1 | 0 | 1 | 0 | 1 | 0 | 1 | 0 | 1 | 0 |
| 1 | 0 | 0 | 1 | 0 | 0 | 1 | 0 | 0 | 1 | 1 |
| 2 | 0 | 0 | 1 | 1 | 1 | 0 | 0 | 0 | 1 | 1 |
| 3 | 1 | 1 | 1 | 1 | 1 | 0 | 1 | 1 | 0 | 1 |

The recording data for the recording track #1 is the data obtained on logical coincidence between the recording data for the recording track #0 and the input data for the recording track #1, that is (0, 0, 1, 0, 0, 1, 0, 0, 1, 1), as shown in Table 2.

The recording data for the recording track #2 is the data obtained on logical coincidence between the recording data for the recording track #1 and the input data for the recording track #2, that is (0, 0, 1, 1, 1, 0, 0, 0, 1, 1), as shown in Table 2.

In the similar manner, recording tracks formed by pits are formed on the optical disc on the basis of recording data on each recording track #i. According to the present invention, pits 12 are formed if the recording data obtained by logical processing is e.g. equal to "1".

The above-described optical disc has a recording capacity equal to n times, for example, twice, that of an optical disc of the same radius, for the same pit width and pit length as those of the read-only optical disc, such as the conventional compact disc.

Meanwhile, the above-mentioned logical processing is not limited to logical coincidence and may comprise e.g. exclusive OR or AND processing as well.

The method for reproducing data from the optical disc having the above-described physical format is hereinafter explained.

Figure 5:
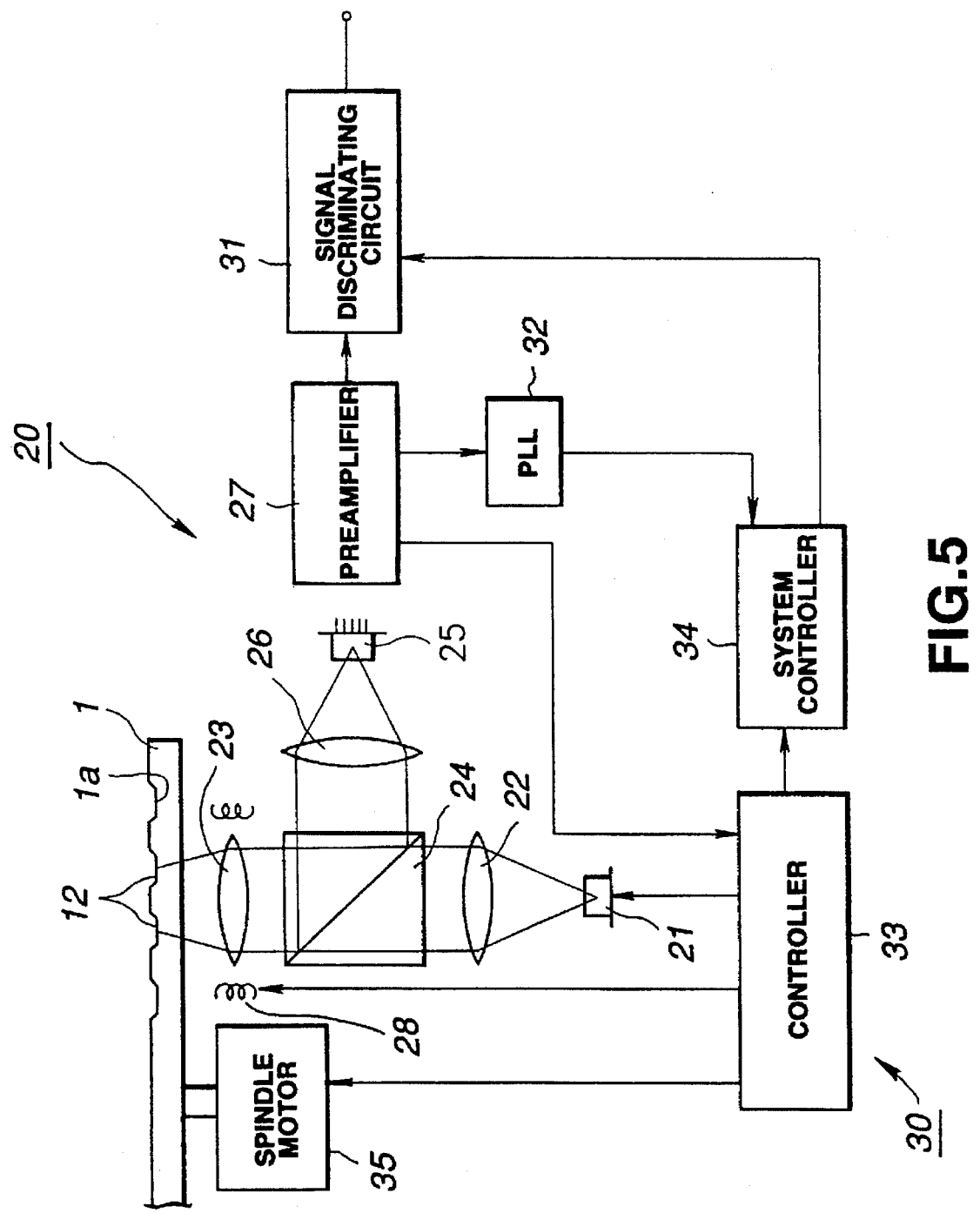
FIG. 5 is a block diagram showing an arrangement of an optical disc reproducing apparatus for reproducing the above optical disc.

The optical disc reproducing apparatus employed for reproducing such optical disc comprises an optical pickup 20 for radiating a light beam to an optical disc 1 and detecting the amount of the light reflected back from a recording surface 1a of the optical disc 1, and a signal processor 30 for reproducing data from replay signals from the optical pickup 20, as shown in FIG. 5. The optical pickup 20 has a laser light source 21, a collimator lens 22, an objective lens 23, a photoelectric transducer or detector 25, a lens 26, a preamplifier 27 and a biaxial device 28. That is, the optical pickup 20 has substantially the same construction as that of the conventional optical pickup employed in optical disc reproducing apparatus such as a compact disc player. The optical pickup 20 differs from the conventional optical pickup in that the track pitch of the optical disc 1 is one-half the spot size of the light beam, and tracking servo is applied so that two neighboring recording tracks #i and #i−1 are simultaneously scanned by the spot 11 of the light beam, as shown in FIG. 4. The scanning width of the light spot is referred to hereinafter as the scanning track width.

The optical pickup 20 is made up of a signal discriminating circuit 31, a phase synchronization circuit (PLL circuit) 32, a controller 33, a system controller 34 and a spindle motor 35.

With the optical disc reproducing apparatus, shown in FIG. 5, the optical disc 1 is run in rotation at CAV by the spindle motor 35.

The laser light source 21, forming a part of the optical pickup 20, includes e.g. a semiconductor laser radiating a light beam having the same wavelength as that of the conventional optical pickup. The collimator lens 22 collimates the light outgoing from the laser light source 21 to cause a parallel light beam to be incident on a beam splitter 24. The beam splitter 24 is formed e.g. by a half mirror for allowing the outgoing light from the laser light source 21 to be transmitted through the objective lens 23 and reflecting the light reflected back from the optical disc 1. The objective lens 23 has the numerical aperture NA equal to that used in a conventional optical pickup and collects the outgoing light from the laser light source 21, after transmission thereof through the beam splitter 24, for radiation thereof on the recording surface 1a of the optical disc 1. Thus the spot size of the light beam on the recording surface 1a of the optical disc 1 is twice the track pitch.

Figure 6A:
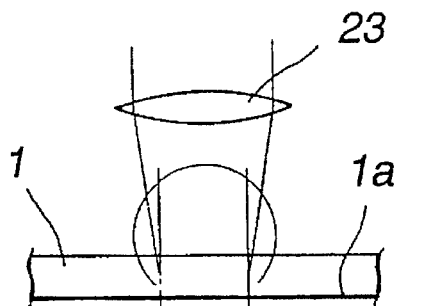
FIGS. 6(a), 6(b), 6(c) and 6(d) show the distribution of intensities of the light reflected by the pits of the optical recording disc.
Figure 6B:
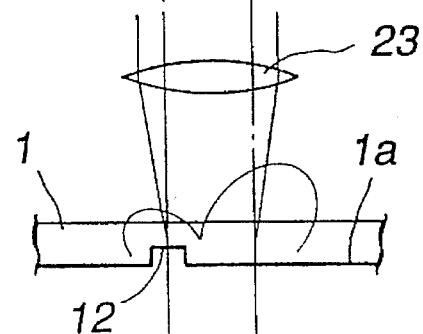
Figure 6C:
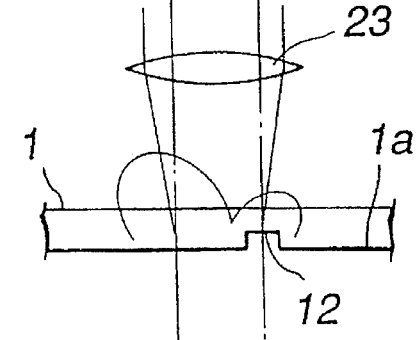
Figure 6D:
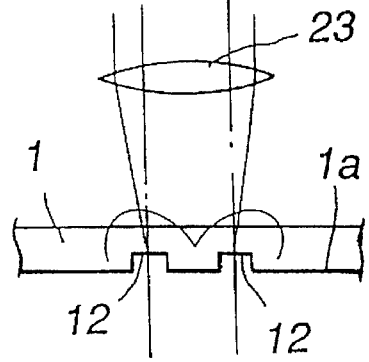

The pits 12 are formed on the recording surface 1a of the optical disc 1, based on recording data, as shown in FIG. 4. If there are no pits 12 on the recording track #(i−1) or in recording track #i, as shown in FIG. 6(a), the distribution of the intensities of the reflected light become symmetrical in the left and right direction on the drawing sheet. If there is no pit 12 on the recording track #(i−1) and there is a pit 12 on the recording track #i, as shown in FIG. 6(b), the distribution of the intensities of the reflected light becomes stronger on the right side on the drawing sheet by diffraction at the pit 12. If there is a pit 12 on the recording track #(i−1) and there is no pit 12 on the recording track #i, as shown in FIG. 6(c), the distribution of the intensities of the reflected light becomes stronger on the left side on the drawing sheet. Finally, if there are pits 12 on both of the recording track #(i−1) and the recording track #i, as shown in FIG. 6(d), the distribution of the intensities of the reflected light become symmetrical in the left and right direction on the drawing sheet, with the intensities becoming weaker than in the case wherein there are no pits.

The reflected light having intensity distribution based on the presence or absence of the pits 12 is collimated by the objective lens 23 so as to be incident again on beam splitter 24 whereby part of the reflected light is separated on reflection.

A condenser lens 26, forming a part of the optical pickup 20, is a single lens or a compound lens having both the function of a lens for condensing the reflected light from the optical disc 1 on the light receiving surface of the detector 25 and the function of a lens producing astigmatic aberration for producing focusing error signals by an astigmatic method, similarly to that of a cylindrical lens.

The detector 25 has a light receiving area having four areas 25a, 25b, 25c and 25d, as shown in FIG. 7, for detecting the amount of the reflected light. If there is no pit 12 in the recording track #(i−1) while there is a pit 12 on the recording track #i, the areas 25a, 25d are lighter, whereas the areas 25b, 25c are darker by diffraction at the pits 12, as indicated by hatching, as shown in FIG. 8(a). If there is a pit 12 on the recording track #(i−1) while there is no pit 12 on the recording rack #i, the areas 25a, 25d are darker, whereas the areas 25b, 25c become lighter, as shown in FIG. 8(b). If there are pits 12 on both of the recording tracks #(i−1) and #i, all the areas 25a to 25d become darker, as shown in FIG. 8(c). Finally, if there are no pits 12 on neither the recording tracks #(i−1) nor #i, all the areas 25a to 25d become lighter, as shown in FIG. 8(d).

The preamplifier 27 is made up of plural differential amplifiers, not shown, and adapted for finding a focusing error signal, a tracking error signal and an RF signal, based on detection output signals produced on detection at the areas 25a to 25d of the detector 25, by the equations (1), (2) and (3):

Focusing Error Signal=$(A+C)-(B+D)$   (1)

Tracking Error Signal=$(A+D)-(B+C)$   (2)

RF signal=$(A+B+C+D)$   (3)

where A, B, C and D stand for output detection signals produced at the respective areas 25a to 25d, respectively.

A biaxial driving device 28 supports the objective lens 23 for movement along the focusing direction which extends parallel to the optical axis of the objective lens 23 and along the tracking direction which extends at right angles thereto. The biaxial device 28 includes an electro-magnetic actuator for driving the objective lens 23 in the above-defined two directions based on error signals from preamplifier 27.

Figure 9A:
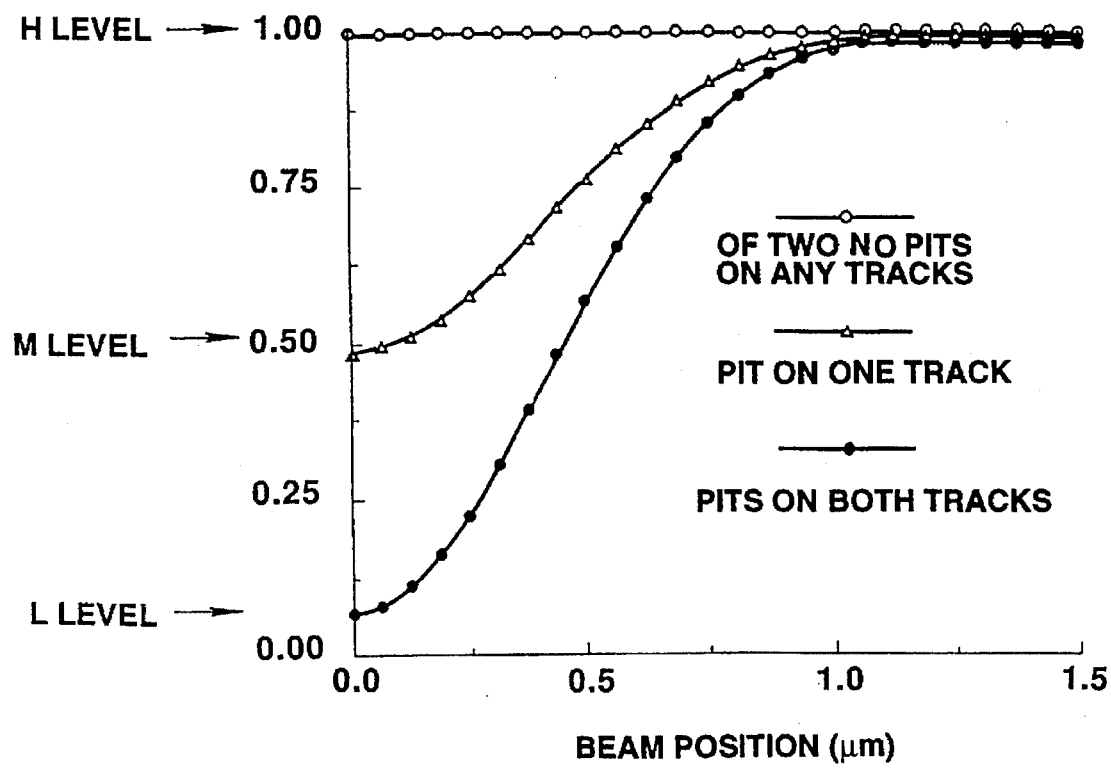
FIGS. 9(a) and 9(b) are graphs illustrating RF signal level as a function of beam position.

The signal decision circuit 31 detects the level of the RF signals from preamplifier 27 and sets the level to "0" and "1", if such level is within a predetermined range and otherwise, respectively, for reproducing data having the same values as the input data. Specifically, if it is assumed that the light spot scans the recording tracks #(i−1) and #i simultaneously by way of tracking, the RF signals assume three levels, namely a high (H) level, an intermediate (M) level and a low (L) level when there are no pits 12 on neither the recording tracks #(i–1) nor #i, when there is a pit in one of these tracks and when there are pits 12 on both the recording tracks #(i–1) and #i, as shown in FIG. 9(a). Consequently, by deciding the RF signal level based on two threshold values, and by setting the level to be "0" and "1" for the M and L levels, respectively, it becomes possible to reproduce data having the same values as the input data.

For reproducing the recording track #1 shown in FIG. 4, if it is assumed that the light spot 11 scans the recording tracks #0 and #1 simultaneously by way of tracking control, the playback signal level from preamplifier 27 becomes

M, L, H, L, M, M, M, L, H, M so that, by setting the M and L levels to "0" and "1", respectively, data having the same values as those of the input data shown in Table 1, that is (0, 1, 1, 1, 0, 0, 1, 1, 0)

may be produced.

By multiple valued detection of the RF signals, data may be reproduced from one recording track to another with the aid of a replay optical beam having a spot size which is e.g. twice that of the track pitch. That is, it becomes possible to reproduce data without the necessity of shortening the wavelength of the laser light source or increasing the numerical aperture NA of the objective lens as compared to those in the conventional optical disc reproducing apparatus.

Figure 9B:
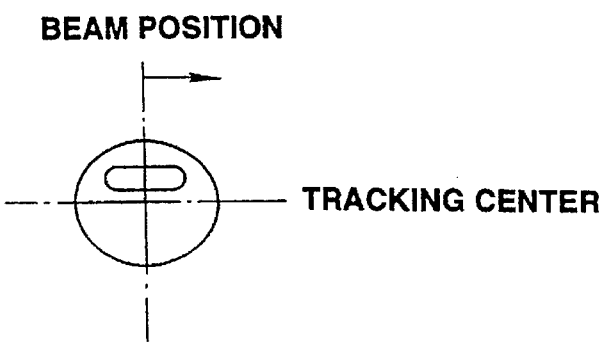

Meanwhile, the beam position on the abscissa of the graph of FIG. 9(a) represents the position of the spot 11 along the track direction, as indicated in FIG. 9(b).

A PLL circuit 32, forming a part of the signal processor 30, extracts and reproduces clocks from the RF signals from preamplifier 27 to transmit the extracted clocks to a system controller 34. The system controller 34 controls the signal discriminating circuit 31 and a controller 33 based on clocks from the PLL circuit 32. Under control by the system controller 34, controller 33 controls the controller device 28, driving the objective lens 23, with the aid of the focusing error signal and tracking error signal according to the equations (1) and (2), until these error signals become equal to "0", by way of focusing and tracking control. Besides, the controller 33 controls the spindle motor so that the optical disc 1 is run in rotation by spindle motor 35 at constant angular velocity (CAV). The controller 33 also causes the optical pickup 20 to be slid in its entirety along the radial direction of the optical disc.

With the above-described first embodiment of the present invention, when data is to be reproduced from the optical disc 1 on which the pits 12 which are the same in contour as those of the compact disc are recorded with high recording density at a track pitch equal to 1/n times the spot size of the reproduce light beam, data may be reproduced from track to track by multiple value detection, e.g. three value detection, of the RF signal level proportionate to the amount of the reflected light.

The reproducing method which is different from the above-described method according to the first embodiment is hereinafter explained.

The optical disc reproducing apparatus employed in the present reproducing method has the same circuit construction as that of the apparatus shown in FIG. 5 for the first embodiment and hence the corresponding description is omitted for avoiding redundancy.

With the present optical disc reproducing apparatus, data recorded on the optical disc I are reproduced based on output detection signals (A+D) and (B+C) produced by the preamplifier 27. Specifically, a playback signal RFA produced by the light-receiving areas 25a, 25d of the detector 25 and a playback signal RFB produced by the light-receiving areas 25b, 25c of the detector 25 are compared to a predetermined threshold value. If such level is less than the threshold value, the playback data is set to "1". In this manner, playback data having the same values as the recording data shown in Table 2 are reproduced for two tracks simultaneously. For reproducing the recording track #i, tracking is controlled so that the recording tracks #(i–1) and #i are scanned simultaneously by the light spot. Then, by finding a logical processing corresponding to the logical processing employed during recording, such as logical coincidence, between the playback data reproduced from the recording track #(i–1), that is the playback data RFA and playback data reproduced from the recording track #(i), that is the playback data RFB, it becomes possible to reproduce data for the recording track #i.

Referring to FIG. 4, playback data produced when the light spot of the playback light beam scans the recording tracks #0 and #1 simultaneously are such that the playback data from the recording track #0 are 1, 0, 1, 0, 1, 0, 1, 0, 1, 0 whereas the playback data from the recording track #1 are 0, 0, 1, 0, 0, 1, 0, 0, 1, 1 these recording data being reproduced simultaneously.

Thus, by finding the logical coincidence between these two data, the data 0, 1, 1, 1, 0, 0, 0, 1, 1, 0 which are of the same values as those of the input data for the recording track #1 shown in Table 1, may now be obtained.

That is, for reproducing data from the optical disc 1 on which the pits 12 contoured similarly to those of the compact disc are formed at a high density at a track pitch equal to 1/n times the spot size of the playback light beam, the recorded data may be reproduced from one recording track to another by detecting the distribution of the reflected light intensity by the detector 25 having plural light-receiving areas.

The method for recording the information on an optical disc having a physical format as shown in FIG. 4 is explained.

First, the method for producing a read-only optical disc is briefly explained.

The production process for the read-only optical disc includes a mastering process and a disc-forming or replication process.

The mastering process is a process up to completion of a stamper which is a metal stamper employed in the replication process. The replication process is a process of producing optical discs or replica in large quantities using the stamper.

Specifically, in the course of the mastering process, a photoresist is coated on a polished glass substrate and data or information is recorded on light exposure on the photosensitive film, by way of cutting. Meanwhile, the data to be recorded has to be prepared in advance by a process known as a pre-mastering process. After the end of cutting, and subsequent development or the like processing operation, a stamper necessary for optical disc replication is prepared by e.g. electroforming.

The stamper information is transcribed on a resin substrate, using the stamper, by e.g. an injection method. After forming a reflective film on the resin substrate, the resin substrate is machined to a disc shape to complete an optical disc as an ultimate product.

Consequently, the recording method for the optical recording medium according to the first embodiment of the present invention is applied to the above-mentioned premastering and cutting.

Figure 10:
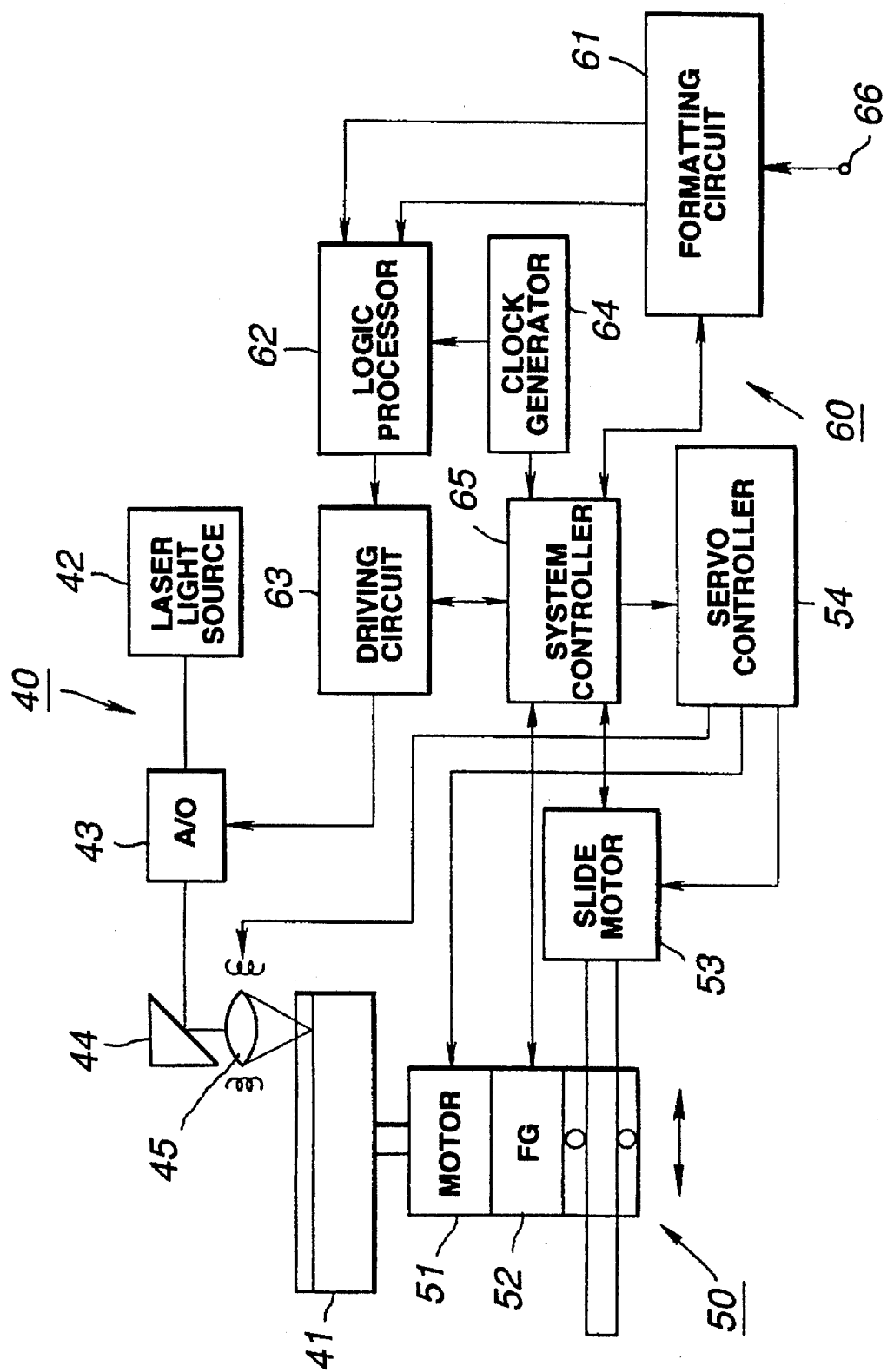
FIG. 10 is a block diagram showing an arrangement of a cutting device.

Specifically, the cutting device has an optical unit 40 for radiating a light beam on a glass substrate 41 coated with a photoresist by way of cutting or recording, a driving unit 50 for running the glass substrate 41 in rotation, and a signal processing unit 60 for translating input data into recording data and for controlling the optical unit 40 and the driving unit 50, as shown in FIG. 10.

The optical unit 40, forming a part of the cutting device, is made up of a laser light source 42, a light modulator 43 for modulating the outgoing light from the laser light source 42 based on the recording data, a prism 44 for bending the optical axis of the modulated beam from the light modulator 43, and an objective lens 45 for collecting the modulated beam reflected by the prism 44 for radiating the beam to the photoresist surface of the glass substrate 41. On the other hand, the driving unit 50 is made up of a motor 51 on which the glass substrate 41 is set and which runs a turntable, not shown, in rotation, an FG pulse generator 52 for generating pulses, referred to hereinafter as FG pulses, for detecting the rotational speed of the motor 51, a slide motor 53 for shifting the glass substrate 41 in the radial direction thereof, and a. servo controller 54 for controlling the rotational speed of the slide motor 53 and controlling he tracking of the objective lens 45. The signal processor 60 is made up of a formatting circuit 61 for appending error correction code to the source data from a computer, entered at an input terminal 66, for forming input data, a logical processing circuit 62 for executing predetermined logical operations on the input data from the formatting circuit 61 for forming the recording data, a driving circuit 63 for driving the light modulator 43 based on recording data from the logical processing circuit 62, a clock generator 64 for supplying clocks to the logical processing circuit 62 etc. and a system controller 65 for controlling servo controller 54 based on clocks from the clock generator 64, With the present cutting device, the glass substrate 41 is run in rotation by the motor 51, while the glass substrate 41 is shifted by the slide motor 53 while being kept in rotation. Specifically, the servo controller 54 controls the motor 51 so that the glass substrate 41 is rotated at a constant angular velocity, while controlling the slide motor 53 so that the radial feed pitch is equal to 1/n times the spot size of the reproduce light beam, for example, so that the radial feed pitch is 0.8 μm per rotation for the spot size of 1.6 μm and n=2, as mentioned above.

As the laser light source 42, a He-Cd laser, for example, is employed, with the outgoing laser light being incident on the light modulator 43. The light modulator 43 may for example be of an acousto-optical effect type such as the acousto-optical modulator and modulates the outgoing light of the laser light source 42 in accordance with the recording data for radiating the modulated light beam on the photoresist surface of the glass substrate 41 via the prism 44 and the objective lens 45. As a result thereof, the photoresist is sensitized in accordance with the recording data. Specifically, the photoresist is sensitized if the wavelength of the outgoing light from the laser light source 42 and the numerical aperture NA of the objective lens 45 are of such values that the spot size of the converged modulated beam is equal to 1/n times the light beam spot size, for example, equal to 0.8 μm or less for the spot size of the reproduce light beam of 1.6 μm, n being equal to 2.

Besides, the formatting circuit 61 appends the computer source data, entered at an input terminal 66, into a selector and a segment and appends address data for the selector and the segment and error code data to form input data which are supplied to the logical processing circuit 62. The formatting circuit 61 also supplies servo bytes for focusing and tracking to the logical processing circuit 62. The logical processing circuit 62, which has enclosed therein a memory having a capacity of storing recording data of (n−1) tracks, sequentially stores the recording data recorded on the preceding continuous (n−1)th track and performs a predetermined processing operation, such as exclusive OR operation, between the recorded data and the input data, for forming recording data to be recorded on the next recording track. The recording data thus formed are supplied to the driving circuit 63. The driving circuit 63 drives the light modulator 43 based on the recording data from the logical processing circuit 62.

As a result thereof, the modulated beam, modulated according to the recording data, is radiated on the photoresist surface of the glass substrate 41, for forming an exposed portion on the glass substrate 41 associated with the pit 12 shown for example in FIG. 4. Subsequently, development and electroforming are carried out to complete the stamper. This stamper is mounted on an injection molding machine and, using this molding machine, a large number of optical discs are produced.

With the optical disc, produced in the manner described above, the track pitch may be set to 1/n, foe example, to ½, of the spot size of the reproduce light beam, such that the recording density may be set to twice that of the compact disc. Besides, the conventional apparatus may be employed by reducing the feed pitch (track pitch) of the conventional cutting device to dispense with renewed capital investment.

It is noted that the present first embodiment may be applied not only to the above-described read-only optical disc, but to an overwritable magneto-optical disc as well.

If the present embodiment is applied to the recording an/or reproducing apparatus for a magneto-optical disc, the reproduce light beam is radiated to cover two recording tracks as in the first embodiment. As a result thereof, the information signals recorded on the magneto-optical disc may be read based on the amount of the detection signals obtained on optical detection of the magneto-optical disc. In such case, data recorded on other recording tracks are re-recorded by overwriting in the same manner as in conventional overwriting. However, in such application in which air separation is completely made as in PCM recording for music and an overwrite area is only for one air, there is no problem raised due to overwriting so that the recording capacity may be increased as compared to that of the conventional magneto-optical disc.

Besides, the first embodiment of the present invention may naturally be applied to an optical storage medium in which the recording tracks are formed in parallel to another, as in memory cards, It will be appreciated from the foregoing that the optical recording medium according to the first embodiment has a track pitch equal to 1/n times the light beam spot size on the recording surface and data obtained on predetermined logical processing between the data recorded on the previous (n−1)th recording track and the input data is recorded on the next n-th recording track so that the recording capacity may be increased by a factor of n as compared to e.g. the compact disc of the same size without changing the bit width, bit length or the spot size of the reproduce light beam spot size.

Besides, with the recording method for the optical recording medium according to the first embodiment of the present invention, by recording data obtained on predetermined logical processing between the data recorded on the directly previous (n−1)th recording track and input data on the next n-th recording track at a track pitch equal to 1/n times the spot size of the light beam on the recording surface, the recording capacity may be increased by a factor of n as compared to e.g. the compact disc of the same size without changing the bit width, bit length or the spot size of the reproduce light beam spot size. The conventional cutting device employed for producing compact discs may be employed without the necessity of providing new cutting devices.

In addition, with the reproducing method for reproducing an optical recording medium according to the first embodiment of the present invention, by multiple-value detection of the amount of the reflected light of the reproduce light spot with a spot size equal to n times the track pitch from the recording surface of the optical recording medium by way of data reproduction, data may be reproduced from one recording track to another using a reproduce light beam having a spot size equal to n times the track pitch. Thus the data may be reproduced without the necessity of shortening the wavelength of the laser light source or increasing the numerical aperture NA of the objective lens. That is, by radiating the reproduce light beam having a spot size equal to n times the track pitch on the recording surface of the optical recording medium, and reproducing the data based on the distribution of the intensities of the reflected light, the data may be reproduced for one recording track to another using the reproduce light beam having the spot size equal to n times the track pitch, so that data may be reproduced without the necessity of shortening the wavelength of the laser light source or increasing the numerical aperture NA of the objective lens.

Figure 11:
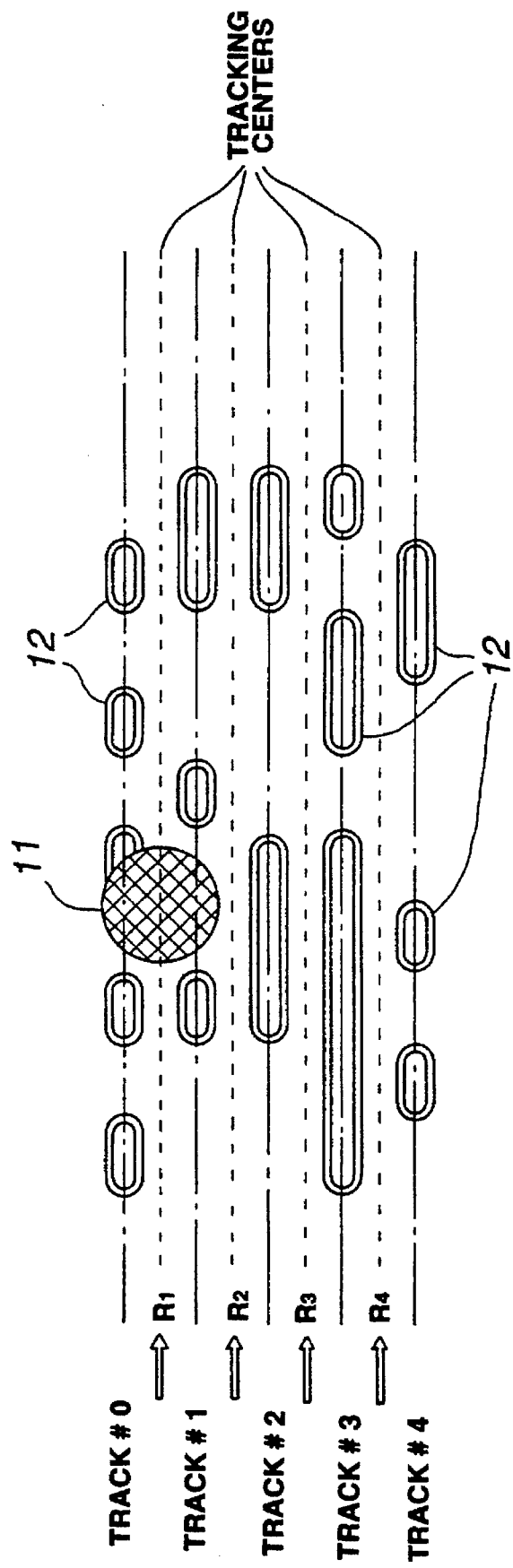
FIG. 11 is an illustrative view for illustrating a verification operation of the first embodiment of the present invention.

Meanwhile, with the first embodiment of the present invention, replay scanning of the recording tracks by the spot 11 of the light beam may be performed as shown by $R_1$, $R_2$, . . . in FIG. 11. In such case, each recording track is necessarily scanned twice for n=2. If data is reproduced based on the distribution of the intensities of the reflected light as mentioned above, the recording data of the two neighboring recording tracks may be extracted simultaneously by each scanning operation. Therefore, if the effects of crosstalk by the pits of the other recording track(s) are feared, it is possible to perform a verifying operation by referring to data obtained from the previous scanning. For example, the playback information for the recording track #1 is completely determined from the playback information of the recording track #1 obtained by scanning $R_1$ and the playback information of the recording track #1 obtained by scanning $R_2$ shown in FIG. 11. The playback information for the recording track #2 is completely determined from the playback information of the recording track #2 obtained by scanning $R_2$ and the playback information of the recording track #2 obtained by scanning $R_3$. By such verifying operation, data playback errors may be reduced or eliminated. Taking an example of the recording track #1, the pit information by the recording tracks #0 and #1 is obtained by scanning $R_1$ from the RF signals as shown in Table 2 as mentioned above. At this time, the reproduced recording data is transiently stored in the signal discriminating circuit 31. The pit information is similarly produced by the next scanning $R_2$ by the recording tracks #1 and #2. The recording data for the recording track #1 and the stored recording data for the recording track #1 are compared at this time with each other as to possible coincidence. A similar verifying operation is performed for the other recording tracks. If it is confirmed that the recording data have been reproduced correctly, the input data shown in Table 1 are reproduced by the predetermined logical processing operation. If non-coincidence of data (replay trouble) is detected by the verification, it suffices to perform scanning by the light beam a second time for the recording track for which the non-coincidence has been found.

Since it becomes possible to cancel cross-talk to realize data playback by such verifying operation, it becomes possible to set the track pitch to a substantially narrower value. That is, further high density recording may be realized on the optical recording medium.

Meanwhile, if the reproducing system is such as to allow the recording data of two recording tracks scanned simultaneously by the same scanning operation, it is noted in connection with the verifying operation that there is no necessity of changing the tracking control or the replay scanning by the same tracking center twice or more. Consequently, the reproducing system may be adopted in conjunction with the above-mentioned reproducing system in which the replay data is obtained from the replay signals RFA derived from the areas 25a and 25d and the replay signals RFB derived from the areas 25b and 25c.

Bedsides, by employing a sum signal (sum of outputs of light-receiving areas 25a to 25d), that is the playback signal RF, and the push-pill signal, that is (outputs of light-receiving areas 25a+25b)−(outputs of light-receiving areas 25c+25d), may be advantageously employed because the recording data of two recording tracks can be reproduced simultaneously.

If, for example, the decision of the case of FIG. 8(a) can be given for paired recording tracks #i and #i−1 shown in FIG. 8, four patterns can be discerned by one scanning. In the cases of FIGS. 8(a) and (b), the diffraction level, obtained as push-pull signal, is inverted in sign relative to each other.

If the diffraction levels for the RF signal and the push-pull signal are indicated by numerical models, the RF signal and the push-pull signal are represented by "1", "1", "2" and "0" and "−1", "+1", "0" and "0", respectively, for FIGS. 8(a) to (d), so that the pit patterns of the neighboring recording tracks can be discerned by the combination of the RF signal and the push-pull signal. In short, recording data of two recording tracks can be extracted simultaneously.

The method for recording an optical recording medium, an optical recording medium and the method for generating tracking error signals, according to a second embodiment of the present invention, will be explained by referring to FIGS. 12 to 17.

Figure 12:
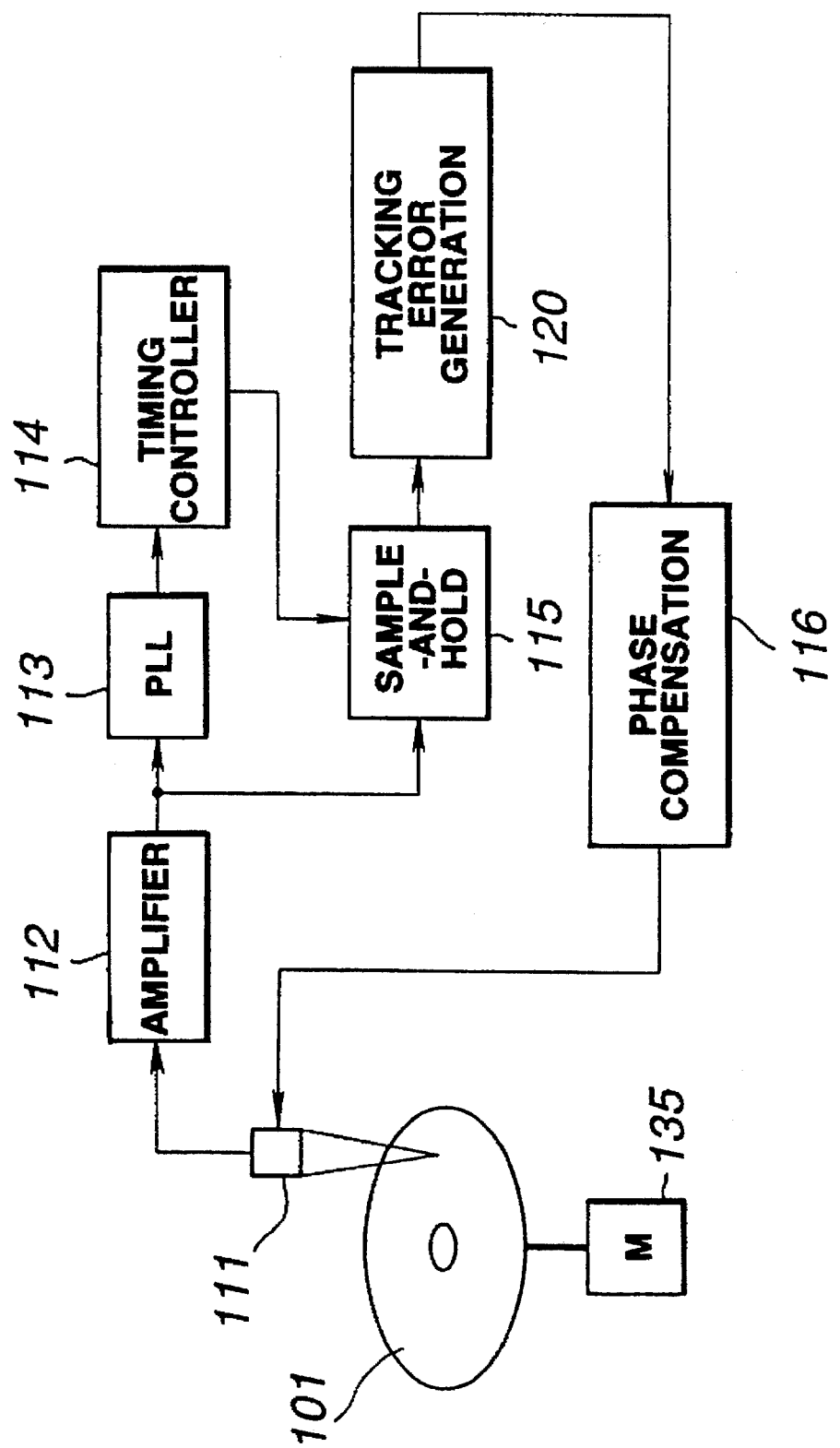
FIG. 12 is a block diagram showing a circuit construction of essential parts of the optical disc device according to the second embodiment of the present invention.
Figure 13:
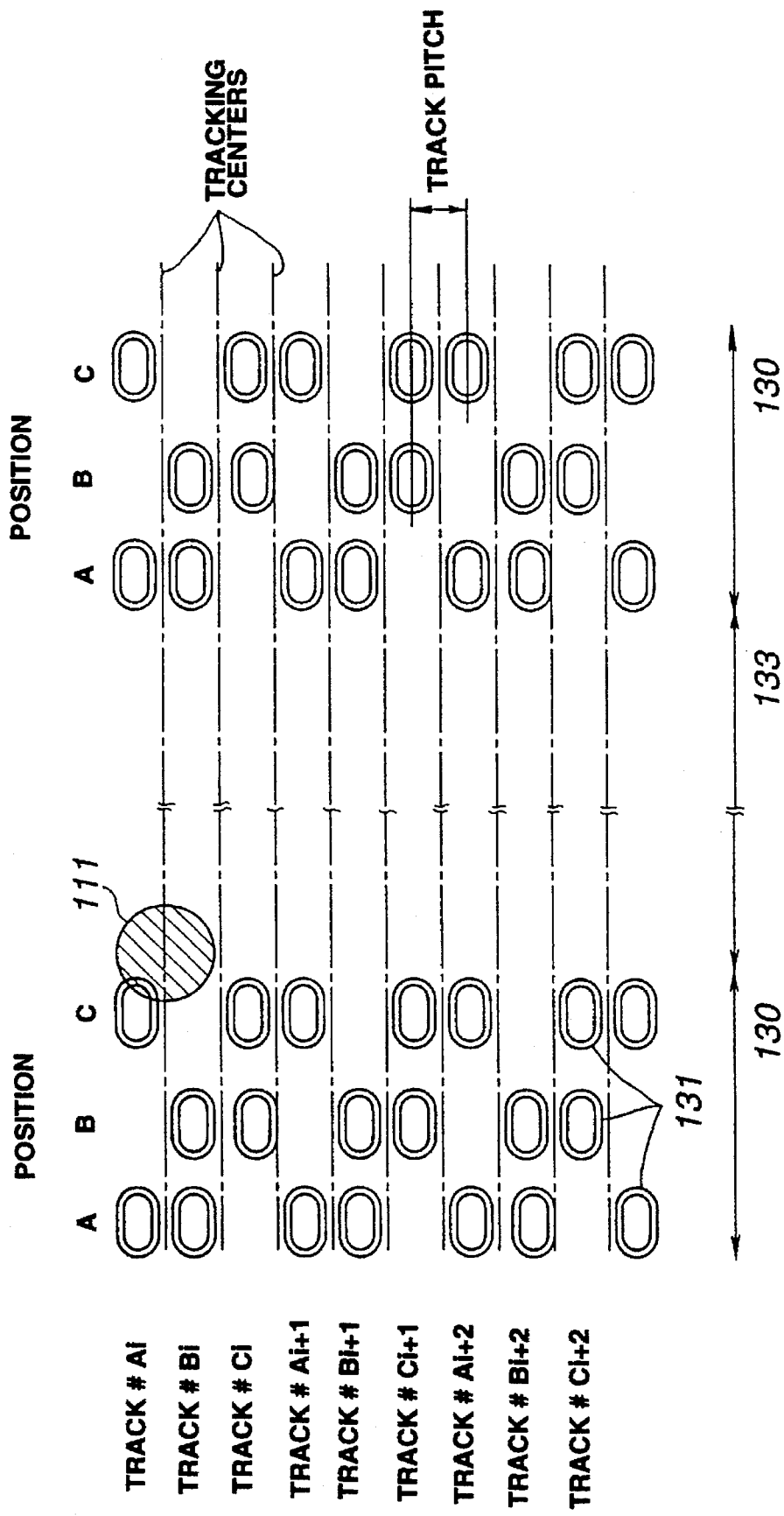
FIG. 13 shows a format of servo pits of the optical disc according to the present invention for illustrating the operation of FIGS. 14(a), 14(b), 14(c), 14(d) and 14(e) are timing charts for illustrating the operation of the above optical disc device.

In the present embodiment, the present invention is applied to an optical recording medium, such as an optical disc of a sample servo control system. FIG. 12 and 13 show a circuit arrangement of essential parts of an optical disc for recording and reproducing data on or from the optical disc in a block diagram and a format of servo pits formed on the recording surface of the optical disc. The format of the servo pits previously formed on the recording surface of the optical disc is explained.

The servo pit format is such a format in which servo pits 131 are pre-formed at positions A and C for recording track #Ai, servo pits 131 are pre-formed at positions A and B for recording track #Bi and servo pits 131 are pre-formed at positions B and C for recording track #Ci (i=1, 2, 3 . . . ), these servo pit patterns being repeated at intervals of three tracks, as shown in FIG. 13.

The track pitch which is the interval between these recording tracks #Ai, #Bi and #Ci is one-half the spot size of the light beam on the recording surface. Consequently, the recording density along the radius of the optical disc is twice that of the conventional optical disc.

Specifically, if the spot size of the light beam on the recording surface is 1.5 to 1.6 µm, as in the case of the optical disc reproducing apparatus, such as a compact disc player, the pit width and pit length of servo pits 31 are equal to 0.5 µm and 0.86 µm, respectively, as in the case of the compact disc, with the track pitch being one-half the spot size, that is 0.8 µm.

The essential parts of the optical disc recording and/or reproducing apparatus, for data recording and/or data reproducing one or from the optical disc having the above-described servo pit format, are hereinafter explained.

Referring to FIG. 12, the optical disc recording and/or reproducing apparatus essentially comprises an optical pickup 111 for radiating a light beam on an optical disc 101 for detecting the amount of the light reflected from the recording surface, an amplifier 112 for amplifying RF signals from the optical pickup 111, a phase locked loop (PLL) circuit 113 for reproducing clocks rom the RF signals amplified by the amplifier 112, a timing controller 114 for generating sampling clocks etc. based on the clocks from the PLL circuit 113, a sample-and-hold circuit 115 for sampling the RF signals from the amplifier 112 using the sampling clocks from the timing controller 114, a tracking error signal generator 120 for generating a tracking error signal by finding difference signals between the three-phase signals from the sample-and-hold circuit 115 and periodically switching and selecting these difference signals, and a phase compensator 116 for phase-compensating the tracking error signal from the tracking error signal generator 120.

The optical disc recording and/or reproducing apparatus effects tracking servo control, using servo pits 131 formed in neighboring recording tracks, such as recording tracks #A and #B, recording tracks #B and #C, or recording tracks #C and #B, as shown in FIG. 13, for data recording or reproduction.

Specifically, the optical pickup 111 is made up e.g. of a laser light source, a collimator lens for collimating the outgoing light from the laser light source, an objective lens for condensing the collimated light from the collimator lens for radiation onto the recording surface of the optical disc 101, a beam splitter for splitting the light reflected by the reflecting surface, a detector for detecting the amount of the reflected light split by the beam splitter, and a biaxial driving device for driving the objective lens along the direction of the optical axis and along the direction at right angles thereto. The spot size of the light beam on the recording surface is the same as that employed in the optical disc reproducing apparatus, such as a compact disc player.

Since the optical disc 101 has a track pitch equal to one-half the spot size, as mentioned above, the light beam radiated from the optical pickup 111 radiates two recording tracks simultaneously and RF signals corresponding to the amount of the reflected light are outputted to the amplifier 112. This amplifier 112 amplifies the RF signals to supply the amplified RF signals to the PLL circuit 113 and the sample-and-hold circuit 115. The PLL circuit 113 reproduces clocks based on a component of the amplified RF signals associated with the servo pit 131 formed at position B to transmit the reproduced clocks to the timing controller 114. Meanwhile, the clocks may also be reproduced by the PLL circuit 113 based on the component of the RF signals associated with the data pit instead of on the component of the RF signals associated with the servo pit. Based on these clocks, the timing controller 114 generates sampling clocks at timings corresponding to positions A, B and C shown in FIG. 13 to transmit the sampling clocks to the sample-and-hold circuit 115. Using the sampling clocks from the timing controller 114, the sample-and-hold circuit 115 sample-holds the RF signals from amplifier 112 to transmit the resulting three-phase signals to the tracking error signal generator 120.

For example, if the light beam spot obliquely scans the recording track by way of a track jump, the sample-and-hold circuit 115 outputs an RF signals RFA, RFB and RFC, produced on sample-holding at timings corresponding to the positions A, B and C, respectively, which are sine waves dephased 120° relative to one another, as shown in FIG. 14(a).

Figure 15:
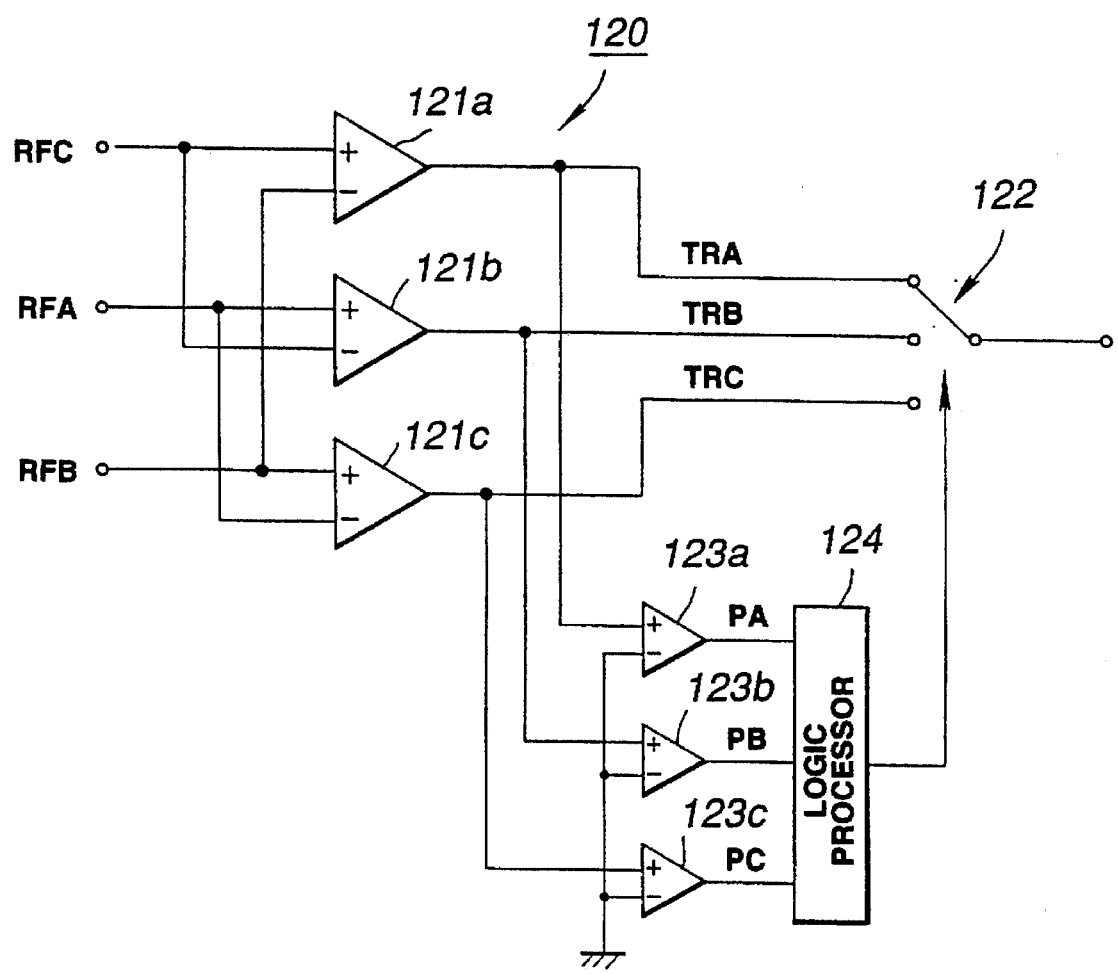
FIG. 15 is a block diagram showing a concrete circuit construction of a tracking error signal generating device forming a part of the above optical disc device.

The tracking error signal generating circuit 120 is made up of first, second and third differential amplifiers 121a, 121b and 121c, for finding differences between the RF signals RFA, RFB and RFC from the sample-and-hold circuit 115, a multiplexor 122 for changing over and selecting outputs of the differential amplifiers 121a, 121b and 121c, first, second and third comparators 123a, 123b and 123c for detecting the polarities of outputs of the differential amplifiers 121a, 121b and 121c, respectively, and a logical processing circuit 124 for controlling the multiplexor 22 by predetermined logical processing of the outputs of these comparators 123a to 123c, as shown in FIG. 15.

The first differential amplifier 121a subtracts the RF signal RFB from the RF signal RFC to generate a tracking signal TRA shown by broken lines, as shown in FIG. 14(b). The second differential amplifier 121b subtracts the RF signal RFC from the RF signal RFA to generate a tracking signal TRB shown by broken lines, while the third differential amplifier 121c subtracts the RF signal RFA from the RF signal RFB to generate a tracking signal TRC similarly shown by broken lines. Thus the tracking error signals TRA, TRB and TRC are sine wave signals dephased by 120° relative to one another, while having a phase lead of 90° relative to the RF signals RFA, RFB and RFC.

The tracking error signals TRA, TRB and TRC, generated in this manner, are supplied to the multiplexor 122 and to the first, second and third comparators 123a, 123b and 123c, respectively.

Meanwhile, the dynamic range of each of these tracking error signals TRA, TRB and TRC is related with the diffraction at the two servo pits 131, as shown in FIG. 13, and may be increased as compared to that of the conventional optical disc. In other words, a tracking error signal having a superior S/N ratio may be produced.

The first to third comparators 123a to 123c detect the signs of the tracking error signals TRA, TRB and TRC to generate sign signals PA, PB and PC which e.g. become positive "1" for the positive level as shown in FIG. 14(c) to transmit these sign signals PA, PB and PC to the logical processing circuit 24.

The logical processing circuit 124 calculates control signals CA, CB and CC, dephased 120° relative to one another, in accordance with the equations (4) to (6), as shown in FIG. 14(d):

$$CA = PC \text{A INV}(PB) \qquad (4)$$

$$CB = PA \text{A INV}(PC) \qquad (5)$$

$$CC = PB \text{A INV}(PA) \qquad (6)$$

The logical processing circuit 124 then controls the multiplexor 122 for selecting the tracking error signals TRA, TRB and TRC for control signal CA equal to "1", for control signal CB equal to "1" and for control signal CC equal to "1", respectively.

In the above equations (4) to (6), signals κ and INV represent logical product and negative logic, respectively.

On the other hand, the multiplexor 122 outputs a tracking error signal which is produced by periodically changing over the three-phase tracking error signals TRA, TRB and TRC which are dephased relative to one another, as shown by solid lines in FIG. 14(b). This tracking error signal is supplied to phase compensator 116. The phase compensator 116 takes charge of phase compensation in the servo loop and phase-compensates the tracking error signal for the multiplexor 122 to transmit the phase-compensated tracking error signal to the optical pickup 111. The optical pickup 111 causes the biaxial device to shift the light beam spot along the radius of the optical disc 101 until the tracking error signal becomes "0".

The servo control loop is formed in the above-described manner to carry out the tracking control. With the tracking control being effective, that is with the light beam spot 32 scanning the center of the recording track, data recording or reproduction is made on or from data areas 133 between the neighboring servo areas 130, 130 on each of which the servo pits 131 are pre-formed in the recording tracks #Ai, #Bi and #Ci.

The tracking error signal outputted from the tracking error signal generator 120 is free of a region 62 other than a region 61 corresponding to stable tracking control as discussed in connection with FIG. 3, as shown in FIG. 14(b), thus assuring stable tracking control at all times.

If assumed that the tracking error signal shown at FIG. 14(b) is produced when scanning the optical disc with the light beam from the inner rim towards the outer rim of the optical disc, the waveform is that seen in the reverse direction along the time scale if the optical disc is scanned from the outer rim towards the inner rim of the optical disc. That is, when the optical disc is scanned from the inner rim towards the outer rim, the signal level is increased perpetually as long as the signal level is changed continuously. Conversely, when the optical disc is scanned from the outer rim towards the inner rim, the signal level is decreased perpetually. Consequently, the direction in which the light beam spot is shifted may be detected depending on the direction in which the signal level is changed, as long as the signal level is changed continuously. In other words, it is possible with the present optical disc recording and/or reproducing apparatus to produce the tracking error signal containing the information as to the light beam scanning direction.

Besides, with the present optical disc recording and/or reproducing apparatus, there is no necessity of providing a divider or a memory employed in the conventional apparatus for generating tracking error signals, thereby simplifying the circuit arrangement.

The other circuitry of the tracking error signal generating circuit 120 is explained. It is noted that circuit parts or components similar to those of the tracking error signal generator 120 shown in FIG. 15 are denoted by the same numerals and the detailed description therefor is omitted for simplicity.

Figure 16:
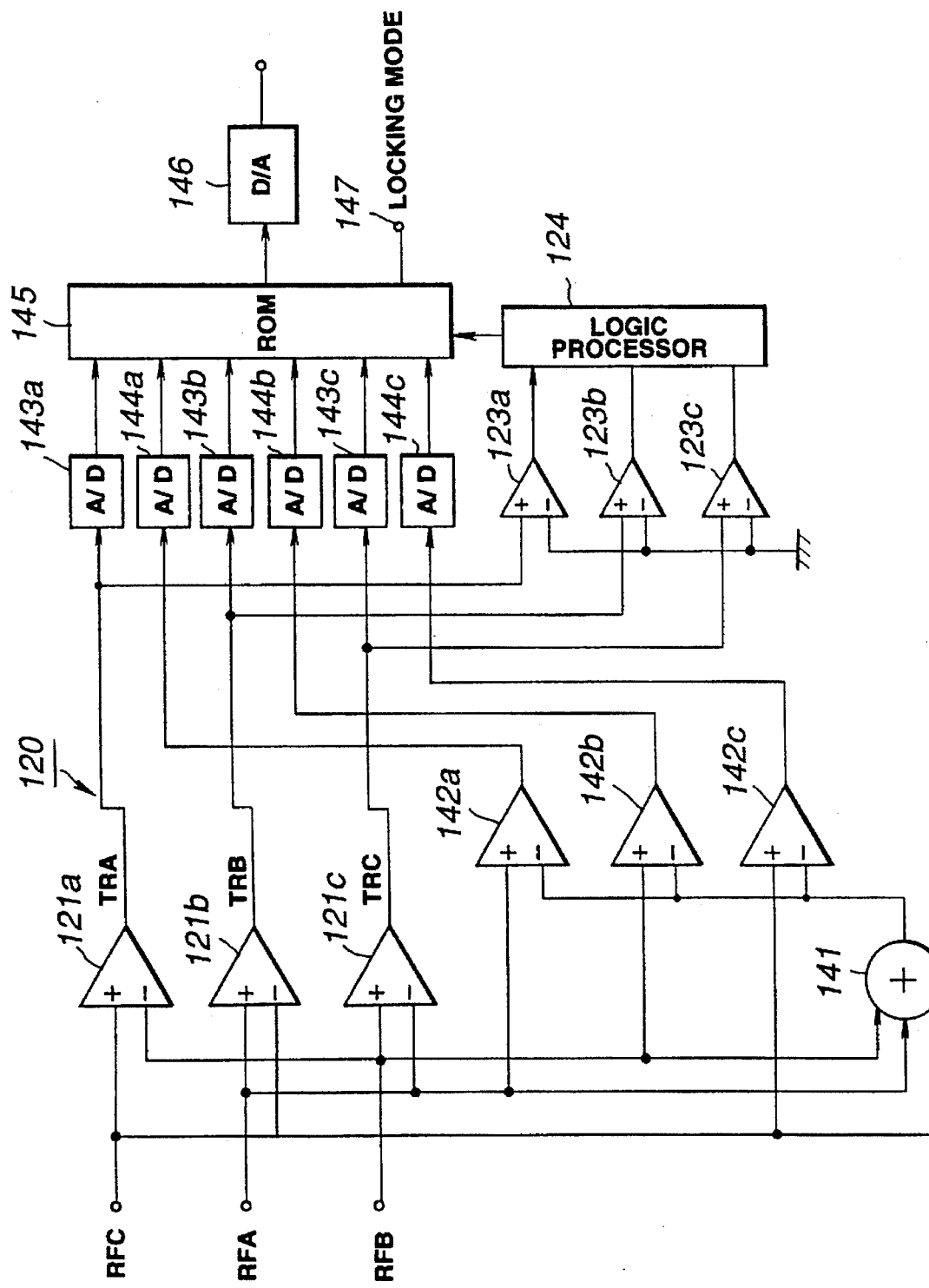
FIG. 16 is a block diagram showing a concrete circuit construction of a tracking error signal generating device forming part of the above optical disc device.

Referring to FIG. 16, the tracking error signal generator 120 is made up of first, second and third differential amplifiers 121a, 121b and 121c for finding differences between the RF signals RFA, RFB and RFC from the sample-and-hold circuit 115, an additive node 141 for summing the RF signals RFA, RFB and RFC from the sample-and-hold circuit 115, first to third differential amplifiers 142a, 142b and 142c for subtracting an output of the additive node from the RF signals RFA, RFB and RFC from the sample-and-hold circuit 115, first, second and third A/D converters 143a, 143b and 143c for converting outputs of the first, second and third differential amplifiers 121a, 121b and 121c into digital signals, first, second and third A/D converters 144a, 144b and 144c for converting outputs of the first, second and third differential amplifiers 142a, 142b and 142c into digital signals, a read-only memory (ROM) 145 for outputting a tracking error signal with outputs of the first, second and third A/D converters 143a, 143b, 143c, 144a, 144b and 144c as addresses, a D/A converter 146 for converting the tracking error signal supplied as digital signal from the ROM 145 into analog signals, first, second and third comparators 123a, 123b, 123c for detecting the signs of the outputs of the first, second and third differential amplifiers 121a, 121b and 121c and the logical processing circuit 124 for controlling the ROM 145 by a predetermined logical operation of the outputs of these comparators 123a, 123b and 123c.

The first, second and third differential amplifiers 121a, 121b and 121c generate tracking error signals TRA, TRB and TRC, respectively, which are sine waves dephased relative to one another by 120° and having a phase lead of 90° relative to the associated RF signals RFA, RFB and RFC, respectively, as shown in FIG. 14(b), and transmit these tracking error signals TRA, TRB and TRC to the first, second and third A/D converters 143a, 143b and 143c and to first, second and third comparators 123a, 123b and 123c.

The first, second and third A/D converters 143a, 143b and 143c translate the tracking error signals TRA, TRB and TRC into digital signals to transmit these tracking error signals TRA, TRB and TRC translated into the digital signals as addresses to the ROM 145.

On the other hand, the additive node 141 adds the RF signals RFA, RFB and RFC from the sample-and-hold circuit 115 together to form a sum signal to the first to third differential amplifiers 142a, 142b and 142c. This sum signal is a mean value or center value of the RF signals RFA, RFB and RFC, which are three-phase ac signals, and hence is a constant C. These differential amplifiers 142a, 142b and 142c subtract the mean value C from the RF signals RFA, RFB and RFC, that is shift these RF signals RFA, RFB and RFC by a dc mean value C, to form and transmit to the first, second and third A/D converters 144a, 144b and 144c the RF signals RFA, RFB and RFC freed of the dc component. These A/D converters 144a, 144b and 144c translate the RF signals RFA, RFB and RFC freed of the dc component into digital signals which are supplied as addresses to the ROM 145.

In this manner, the tracking error signals TRA, TRB and TRC, translated into digital signals, and the RF signals RFA, RFB and RFC, similarly translate into digital signals, are supplied to the ROM 145, in which there is pre-stored a table which specifies a certain relation of the tracking error signals TRA, TRB and TRC and the RF signals RFA, RFB and RFC. Consequently, the ROM 145 outputs tracking error signals shown by solid line in FIG. 14(e), based on the tracking error signals TRA, TRB and TRC and the RF signals RFA, RFB and RFC as addresses.

Specifically, if a displacement of the light beam spot from the tracking center is denoted as x and the RF signal RFA from the sample servo circuit 115 is denoted as $V_{QA}$ which is given by the following equation (7), $$V_{QA} = K_1 \cos(2\pi x/p) + C \qquad (7)$$

an output $v_{QA}$ of the differential amplifier 142a is given by the equation (8):

$$v_{QA}=V_{PA}-C=K_1\cos(2\pi x/p) \qquad (8)$$

On the other hand, since the tracking error signal TRA from the first differential amplifier 121a is dephased 90° relative the RF signal RFA, if the tracking error signal TRA is denoted as $V_{PA}$, $V_{PA}$ is given by the equation (9):

$$v_{PA}=K_2\sin(2\pi x/p) \qquad (9)$$

where $K_2/K_2=1$.

From these equations (8) and (9), the signal $v_x$ representing the displacement x is given by the following equation (10):

$$v_x=(p/2\pi)\tan^{-1}(v_{PA}/v_{QA}) \qquad (10)$$

Meanwhile, since the signal $v_x$ is proportionate as a principle to the displacement X for $|X|<(p/4)$, a tracking error signal $TRA_1$ indicated by a broken line in FIG. 14(e) may be obtained by storing values on a straight line extended from the range of $|X|<(p/4)$ as table values in the ROM 145 for a range of $|X|<(3p/2)$, and by looking up the table using the digitized tracking error signal TRA (vpA) and digitized RF signal RFA ($v_{QA}$).

Similarly, table values for the remaining tracking error signals $TRB_1$, $TRC_1$ are stored in a similar manner and read out using the digitized tracking error signal TRB and RF signal RFB or using the digitized tracking error signal TRC and RF signal RFC, respectively.

The above-mentioned control signals CA, CB and CC, shown in FIG. 14(d), from the logical processing circuit 124, and control signals for switching between a normal mode and a locking mode from terminal 147 are supplied to the ROM 145 as readout control signals. Under the normal mode, the tracking error signals $TRA_1$, $TRB_1$ and $TRC_1$ are selected for the control signals CA, CB and CC equal to "1", respectively, so that a tracking error signal, derived form periodic switching of three-phase tracking error signals $TRA_1$, $TRB_1$ and $TRC_1$, dephased relative to one another, is outputted, as shown by a solid line in FIG. 14(e).

Under the locking mode, one of the tracking error signals $TRA_1$, $TRB_1$ and $TRC_1$ is selected and outputted without regard to the control signals CA, CB and CC.

Figure 3:
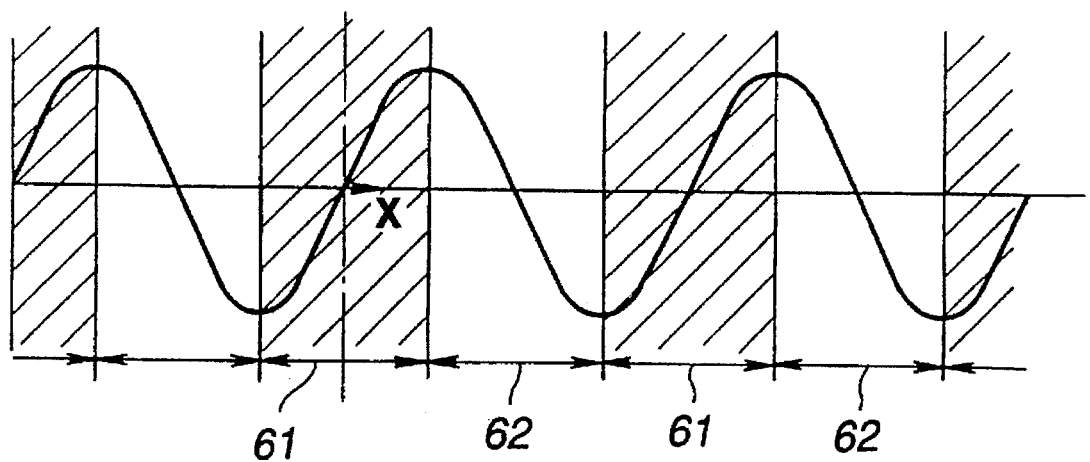
FIG. 3 is a waveform diagram of tracking error signals produced from a conventional optical disc.

The tracking error signal, read out as described above from the ROM 145, are translated by the D/A converter 146 into an analog signal, which is supplied to optical pickup 111 via the phase compensator 116, in the same manner as in the previous embodiment, The result is that the tracking error signal is free of waveform portions indicated at 62, other than the waveform portions 61, corresponding to stable tracking control region, as shown in FIG. 3, in the same manner as in the previous embodiment, thus assuring stable tracking control at all times. Besides, the tracking control signal can be obtained which contains the information concerning the scanning direction of the optical beam.

The track jump operation is hereinafter explained.

If, with tracking control is on the recording track #Ai, track jump is to be made from the recording track #Ai to recording track #Bi , a control signal is supplied via the terminal 147 to switch the reading from the ROM 145 compulsively from tracking error signal $TRA_1$ to $TRB_1$, at the same time that, without regard to the control signals CA, CB or CC, a locking mode is set in which tracking error signal switching is not made.

Figure 17:
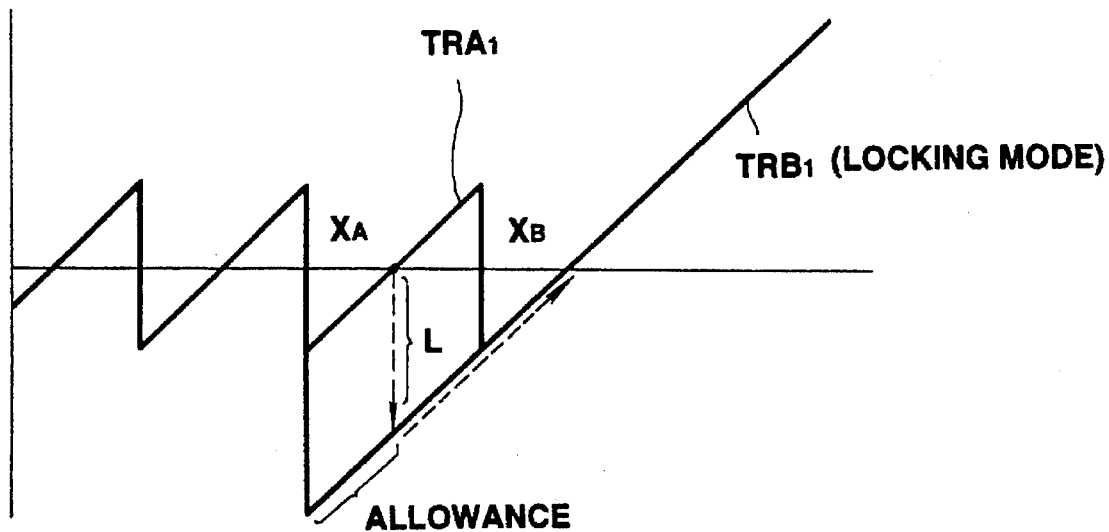
FIG. 17 is a timing chart for illustrating track jump of the above optical disc device.

Specifically, with the tracking control on the recording track #Ai, the light beam spot is at the tracking center of the recording track #Ai corresponding to the zero-crossing point $X_A$ of the tracking error signal $TRA_1$ for a range of the control Signal CA equal to "1", as shown in FIG. 17. If the readout from ROM 145 is switched to the tracking error signal $TRB_1$, without regard to the controlling signals CA, CB or CC, a level L signal is outputted from the ROM 145, with the optical pickup 111 causing the light beam spot to be moved to the tracking center of the recording track #Bi corresponding to the zero-crossing point $X_B$ of the tracking error signal $TRB_1$ to complete track jump.

It will be seen from above that track jump may be made with the present optical disc recording and/or reproducing apparatus with the tracking control remaining in the closed loop state, it being unnecessary to open the loop once as in the conventional system. In other words, the electrical ,components required for opening the tracking control loop may be eliminated to enable reduction in production costs.

Besides, by providing the above-described locking mode, the capturing range for tracking control may be enlarged so that, should any disturbance be produced after switching from the tracking error signal $TRA_1$ to the tracking error signal $TRB_1$ to set the locking mode, stable track jump may be made because of the above-described allowance shown in FIG. 6(e).

In addition, the servo pits 131 may be formed using a conventional cutting device for the compact disc without the necessity of renewed capital investments. That is, the conventional cutting device may be used by halving its feed pitch along the radius of the optical disc.

The tracking control circuit of the optical disc recording and/or reproducing apparatus may also be employed as a tracking control device for the conventional magneto-optical disc recording and/or reproducing apparatus.

It is to be noted that the present invention is not limited to the above-described embodiments, and may be applied to an optical recording medium in which recording tracks are formed in parallel, such as a memory card.

It will be seen from above that, with the second embodiment of the present invention, stable tracking control may be achieved for data recording by employing pits formed in the mutually adjacent recording tracks as servo pits for producing tracking error signals for tracking control.

Besides, conventional wobbling pits are not required for producing the tracking error signal to enable the track pitch to be narrowed to raise the recording density along the track pitch.

On the other hand, it is possible with the second embodiment of the present invention to produce the tracking error signal by radiating a light beam on a recording medium, finding differences between the three-phase signals obtained on sampling RF signals based on the amount of the reflected light from the recording medium at the positions of the servo pits and by periodically switching the resulting difference signals. Besides, stable track jump may be achieved because the track jump may be carried out with the tracking control being effective. In addition, the capturing range may be enlarged during the track jump.

With the above-described first embodiment, recording tracks are formed on the optical disc with the track width of 1.6 μm and the track pitch of 0.8 μm for raising the recording density, and information signals are recorded on such optical disc. The information signals are read from the optical disc on the basis of the signal level of a sum signal derived from the detector 25 designed to detect the reflectance of the light beam radiated on the optical disc.

However, the sum signal derived from the different light-receiving regions of the detector 25 is constant in period but changed in amplitude between the state in which the pit is present on only one of the left and right sides of the tracking center, as shown in FIGS. 8(a) and 8(b), and the state in which pits are present on both sides of the tracking center, as shown in FIG. 8(c). As a result thereof, two modulation transfer function curves (MTF curves) are produced, that is an MTF curve for the case in which a pit is present only on one side of the tracking center and an MTF curve for the case in which pits are present on both sides of the tracking center, as shown in FIGS. 9(a) and 9(b), thus rendering it impossible to identify the characteristics of the sole MTF curve. If the output sum signal is supplied in this state to an equalizer circuit, an eye pattern of the sum signal is collapsed in FIG. 18.

Such problem may be resolved by an arrangement according to a third embodiment now to be described.

FIG. 18 shows a part of the reproducing circuit according to the third embodiment in which the detector 25 has four light-receiving areas 25a, 25b, 25c and 25d similarly to the detector of the first embodiment. With the present third embodiment, these four light-receiving areas 25a to 25d are treated as being a first light-receiving area 251 made up of two light-receiving areas 25a, 25d on one side of the tracking center and two light-receiving areas 25b, 25c on the other side of the tracking center. In effect, a sum signal of detection outputs of the light-receiving areas 25a, 25d and a sum signal of detection outputs of the light-receiving areas 25b, 25c are supplied to a first equalizer 201 and a second equalizer 202, respectively. These first and second equalizers 201, 202 are supplied with output signals of the first and second light-receiving areas 251, 252, respectively, and are designed to correct the output signals from the first and second light-reciving areas 251, 252 in a manner of raising a mid region of the spatial frequency of the MTF.

The output signal from the first light-receiving area 251 supplied from the first equalizer 201 and the output signal from the second light-receiving area 252 supplied from the second equalizer 202 are supplied to a subtraction circuit 206 for generating a push-pull signal on signal subtraction. The output signal from the first light-receiving area 251 supplied from the first equalizer 201 and the output signal from the second light-receiving area 252 supplied from the second equalizer 202 are also supplied to an addition circuit 207 for generating a sum signal on signal addition.

A pre-stage variable resistor 203 is connected in parallel to the subtraction circuit 206 upstream of the subtraction circuit. The proportion of output signals of the equalizers 201, 202 may be adjusted by adjusting the resistance value of the variable resistor 203. Similarly, pre-stage variable resistors 204, 205 are connected upstream of the addition circuit 207 for adjusting the gain of the addition circuit 207.

That is, output signals from the first light-receiving area 251 and the second light-receiving area 252 of the detector 25 are supplied to the first and second equalizers 201, 202 so as to be supplied thence to the subtraction circuit 206 and the addition circuit 207. The result is that the push-pull signal as shown in FIG. 19(a) is produced at the subtraction circuit 206 and the sum signal as shown in FIG. 19(b) is produced at the addition circuit 207. The sum signal from the addition circuit 207 is supplied via pre-amplifier 27 in the first embodiment shown in FIG. 4 to the signal discriminating circuit 31 where the signal level of the sum signal produced by the addition circuit 207 is discriminated.

In this manner, with the reproducing circuit shown in FIG. 18, the output signals of the first and second light-receiving areas 251, 252 of the detector 25 on both sides of the tracking center are corrected for signal characteristics by the first and second equalizers 201, 202 before signal subtraction or addition. That is, the output signal from the first light-receiving area 251 of the detector 25 is produced as a result of detection of the pits on one side of the tracking center, so that the MTF characteristics thereof can be determined monistically. Similarly, the output signal from the second light-receiving area 252 of the detector 25 is produced as a result of detection of the pits on the other side of the tracking center, so that the MTF characteristics thereof can similarly be determined monistically. The result is that the sum signal produced by the addition circuit 207 after correction by the first and second equalizers 201, 202 is produced as a signal which is constant in both the period and the signal level.

In the previously described first embodiment, the sum signal of the light-receiving areas 25a to 25d of the detector 25 is employed as an RF signal and the information signals recorded on the optical disc 1 are read on the basis of the signal level of the sum signal. However, if the sum signal of the light-receiving areas 25a to 25d of the detector 25 is employed as an RF signal, as in the previously described first embodiment, the sum signal undergoes fluctuations with fluctuations in the operating conditions of the optical pickup 20 or in the synchronizing signal components in the sum signal caused by changes in reflectance of the optical disc 1, so that an error in detection is liable to be produced in the level discrimination of the read-out signal level.

Such problem may be resolved by a fourth embodiment which is now to be explained.

With the present fourth embodiment, the push-pull signal produced on subtracting the output signal of the first and second light-receiving regions 251, 252 supplied from first and second equalizers 201, 202 in the subtraction circuit 206 of the reproducing circuit shown in FIG. 18 for the third embodiment is employed as an RF signal. In the present fourth embodiment, similarly to the third embodiment, the detector 25 is made up of four light-receiving areas 25a, 25b, 25c and 25d. These light-receiving areas 25a to 25d are treated as being a first light-receiving region 251 made up of the light-receiving areas 25a and 25d on one side of the tracking center and a second light-receiving region 252 made up of the light-receiving areas 25b and 25c on the other side of the tracking center.

Figure 20:
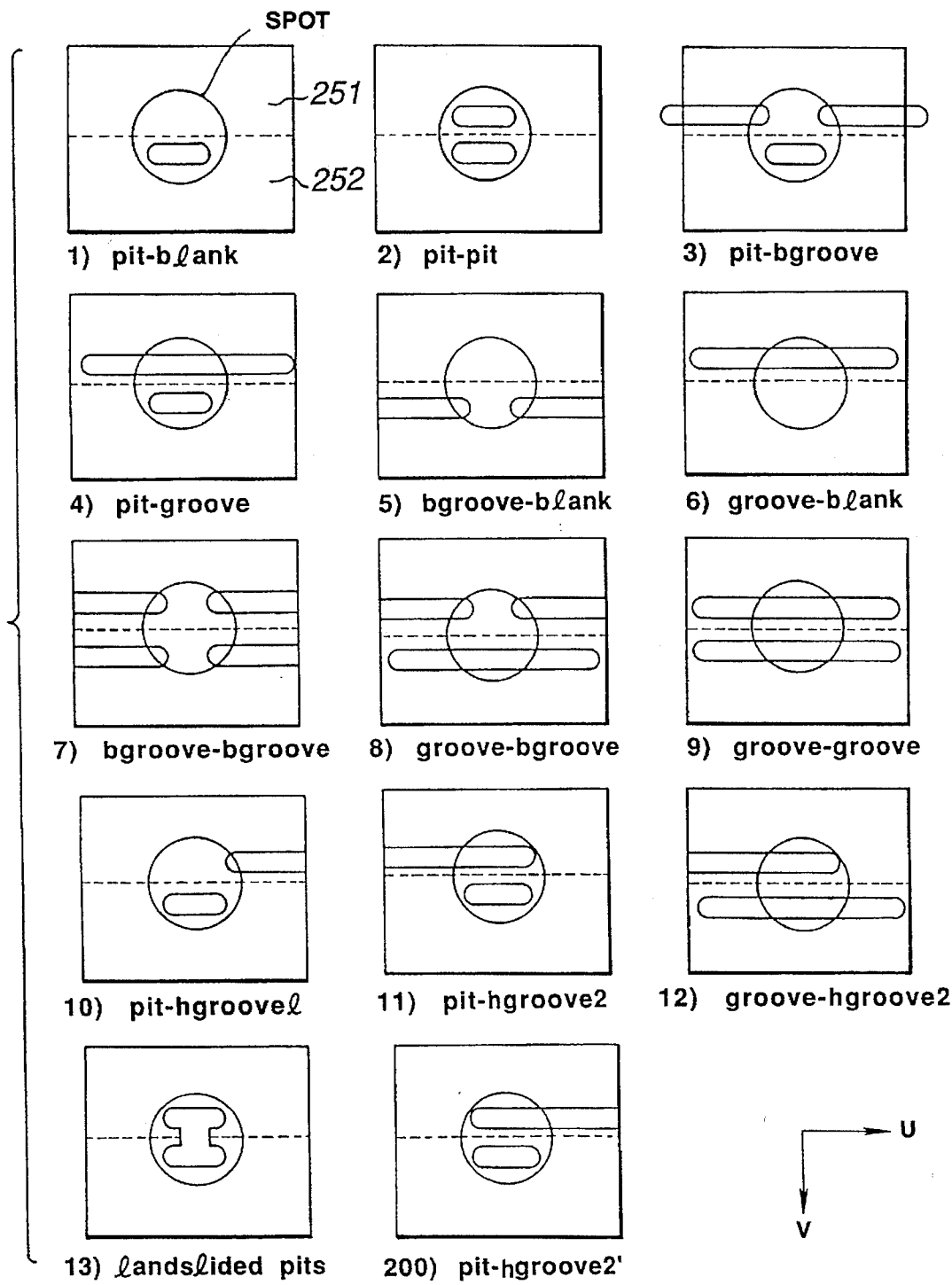
FIG. 20 shows various pit patterns employed for simulation for illustration of a fourth embodiment of the present invention.

The relation between the spot of the light beam formed on the first and second light-receiving regions 251, 252 of the detector and the pits on the recording tracks #i−1 and #i on the optical disc 1 is indicated by patterns shown in FIG. 20. These patterns of FIG. 20 are obtained by simulation.

Figure 21:
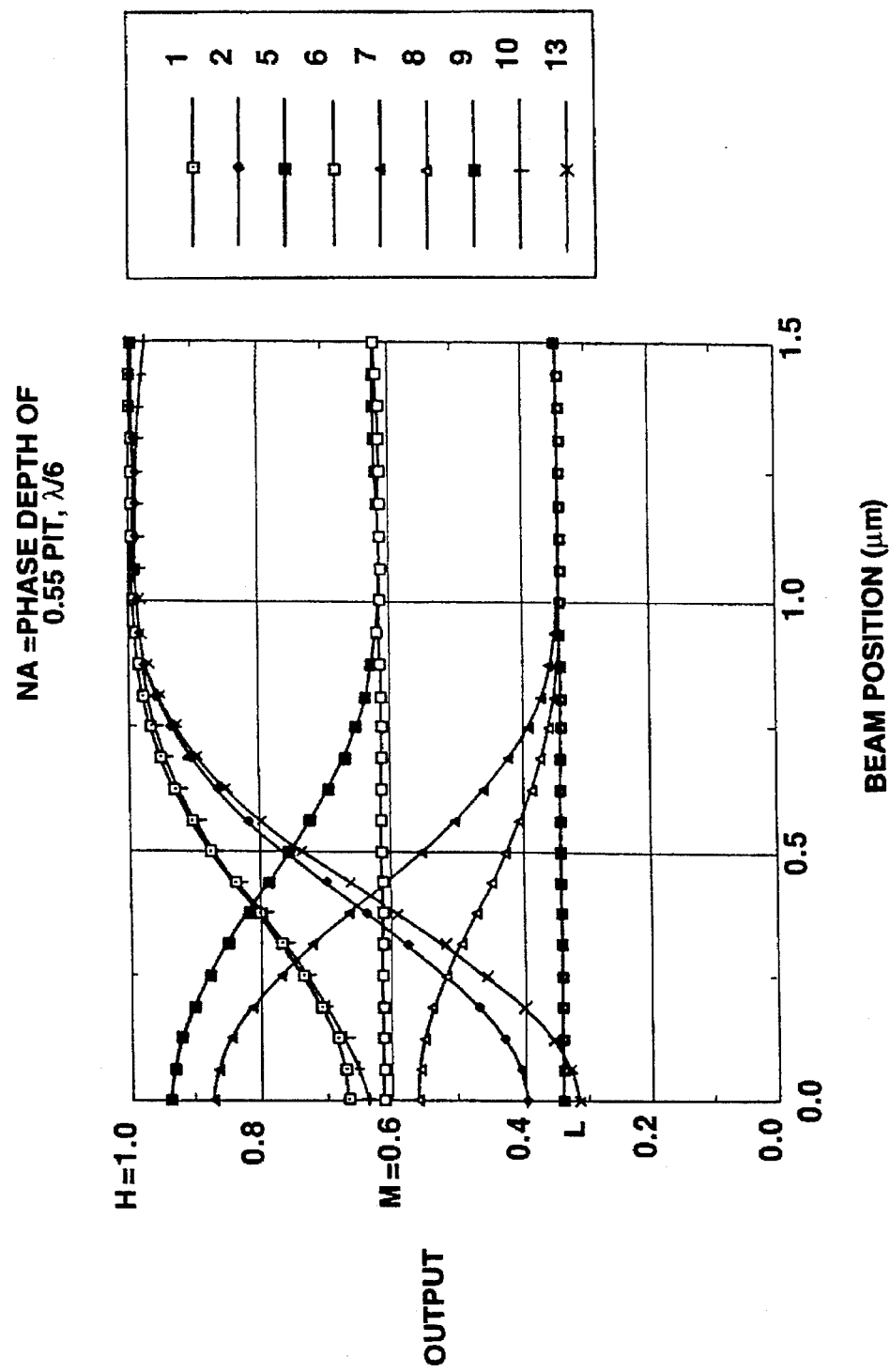
FIG. 21 is a waveform diagram showing the sum signal based on the pit patterns shown in FIG. 20.
Figure 22:
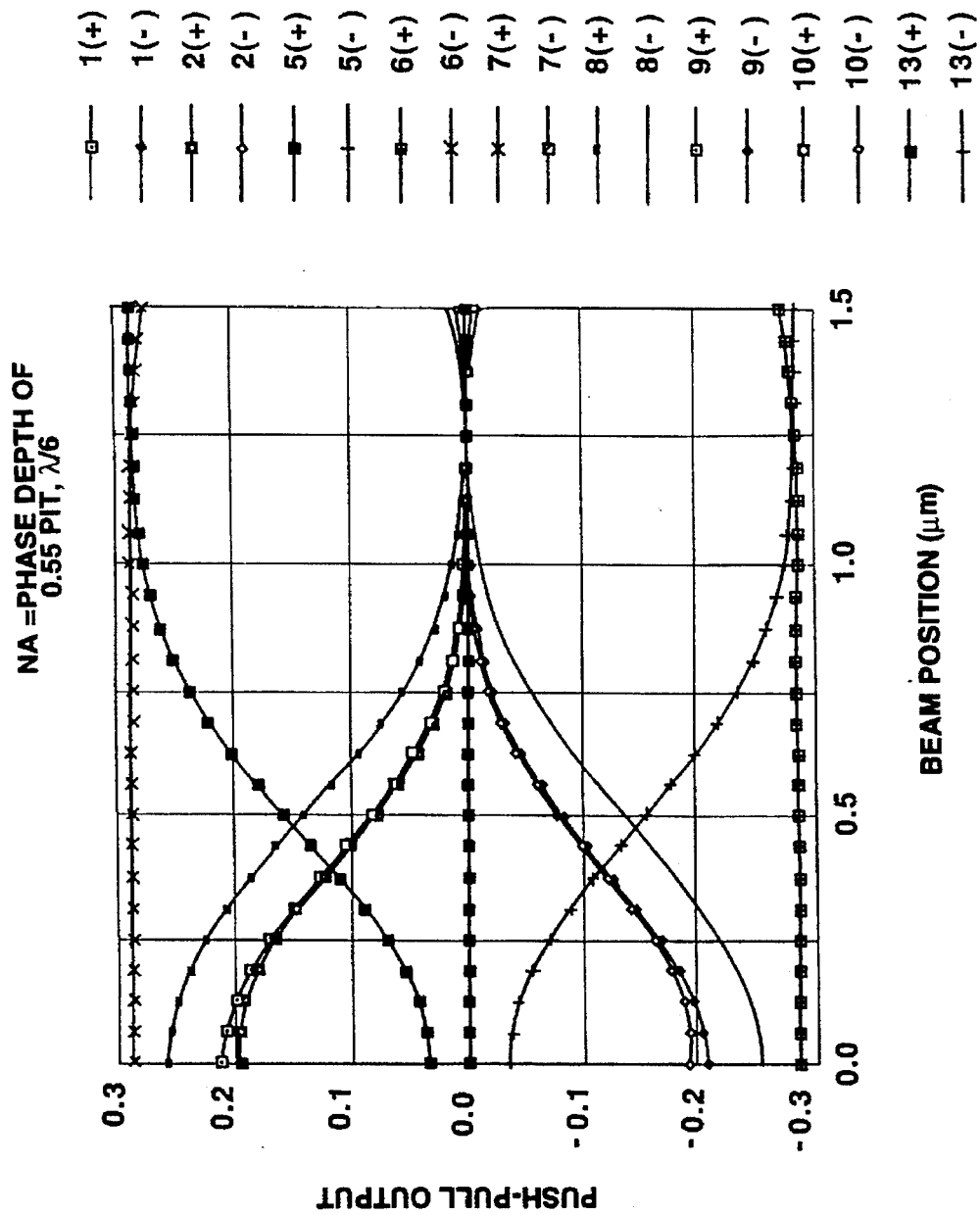
FIG. 22 is a waveform diagram of push-pull signals based on the pit patterns shown in FIG. 20.

The waveforms of the sum signal and the push-pull signal, generated on the basis of the detection output of the detector 25, associated with the patterns shown in FIG. 20, are as shown in FIGS. 21 and 22. In FIG. 21, the waveforms of the sum signals for the patterns of FIG. 20 are shown for the numerical aperture NA=0.55 and the pit phase depth=$\lambda/6$. In FIG. 21, the beam position on the detector 25, as viewed along the arrow U in FIG. 20 from the center of the light beam spot, is plotted on the abscissa, and the signal level of the sum signal is plotted on the ordinate. The sum signal shown in FIG. 21 is normalized in a domain between 0 and 1. In FIG. 21, 1.0, 0.6 and 0.35 stand for the high(H) level, a mid (M) level and a low (L) level, respectively.

In FIG. 22, the waveforms of the push-pull signals for the patterns of FIG. 20 are shown for the numerical aperture NA=0.55 and the pit phase depth=$\lambda/6$. The sum signal shown in FIG. 22 is normalized in a domain between −0.5 and +0.5. In FIG. 22, +0.2 or higher, 0.0 and −0.2 or less stand for the high (H) level, a mid (M) level and a low (L)

level, respectively. Meanwhile, if the mid (M) level is set to 0, the high (H) level and the low (L) level may be indicated as "+" and "−", respectively. In FIG. 22, similarly to FIG. 21, the beam position on the detector 25, as viewed along the arrow U in FIG. 20 from the center of the light beam spot, is plotted on the abscissa, and the signal level of the sum signal is plotted on the ordinate.

In the examples shown in FIGS. 20 to 22, since the phase depth of the pits of the optical disc is set to λ/6, both the sum signal and the push-pull signal are produced simultaneously. It is, however, not mandatory to set the phase depth of the pits of the optical disc to λ/6 and the pt phase depth defined by λ/4<pit phase depth<λ/8 suffices.

Figure 1:
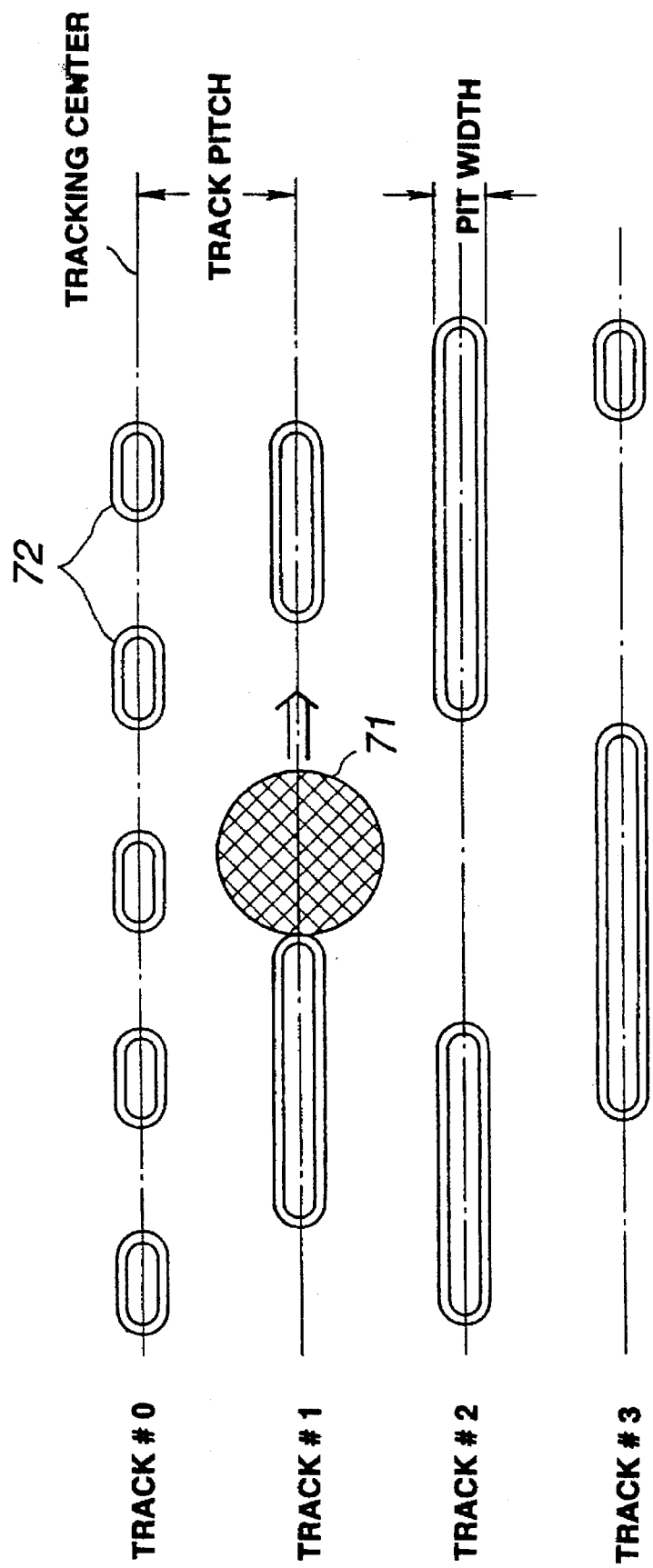
FIG. 1 shows a format of pits recorded on a recording surface of a conventional compact disc.
Figure 2:
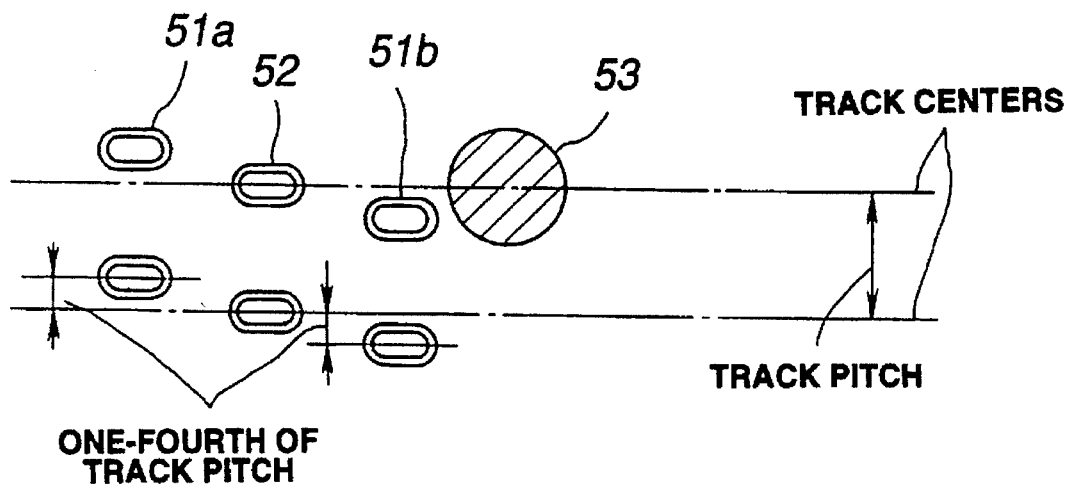
FIG. 2 shows a format of servo pits of a conventional optical disc.

With the present fourth embodiment of the present invention, the information recorded on the optical disc 1 shown in FIG. 1 is read. using the sum signal shown in FIG. 21 and the push-pull signal shown in FIG. 22. That is, the light beam is radiated from the optical pickup 20 so as to straddle two recording tracks such as the recording tracks #0 sand #1, as shown in FIG. 4, as in the first embodiment mentioned above. The resulting reflected light from the optical disc 1 is received by the detector 25 and a differential signal of output signals of the first and second light-receiving regions 251, 252, that is the push-pull signal, is employed as an RF signal. By employing in this manner a differential signal of the output signals of the first light-receiving area 251 and the second light-receiving area 252 of the detector 25, in-phase components in the sum signal produced by various changes in the operating conditions in the optical system of the optical pickup 20 or in the reflectance of the optical disc 1 cancel one another for avoiding errors otherwise produced in signal level discrimination of the RF signals on reading the optical disc 1. Although it is possible to read the information recorded on the optical disc 1 based on the push-pull signal as the RF signal, even although the signal level of the detection output signal from detector 25 is lowered due to changes in the reflectance of the optical disc 1, the sum signal obtained by summation of the output signals of the first light-receiving area 251 and the second light-receiving area 252 of the detector 25 is to be employed for improving accuracy in subsequent discrimination in the signal decision circuit 31. In such case, the information recorded on the optical disc 1 is read by taking a matrix of the push-pull signal and the sum signal.

Figure 23:
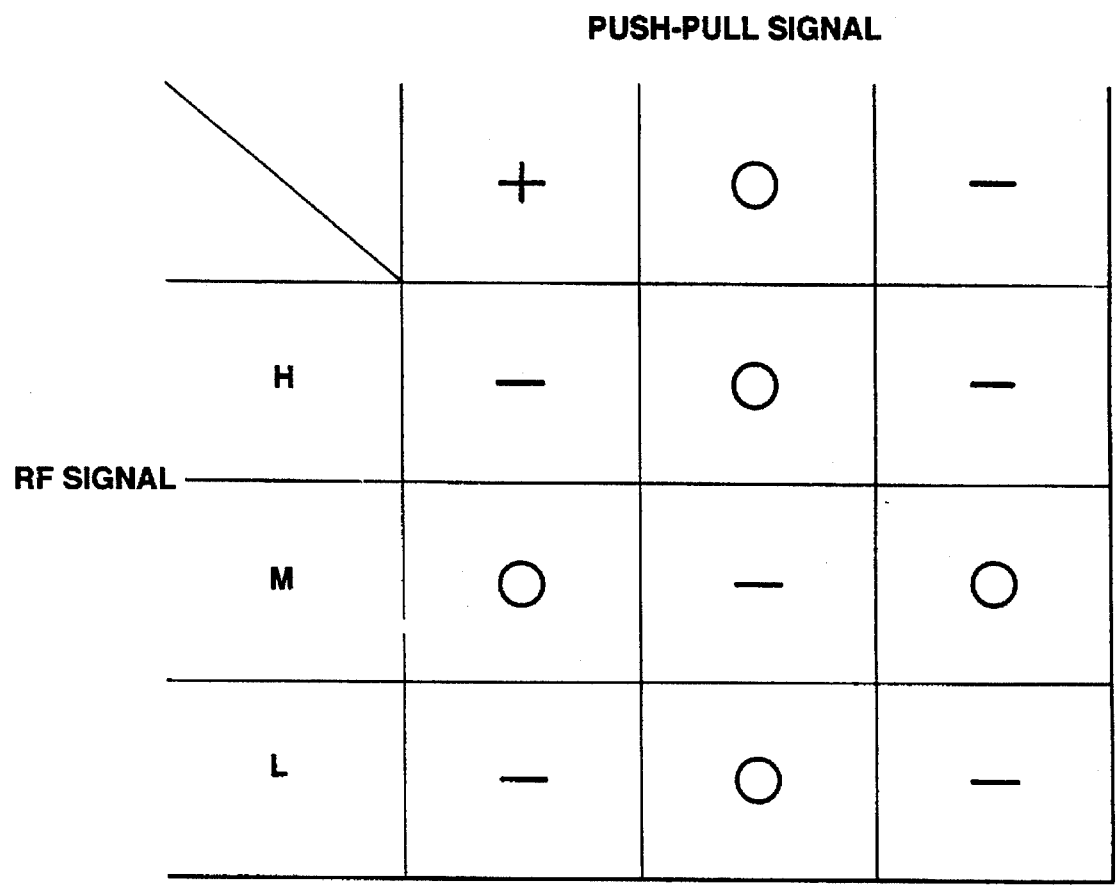
FIG. 23 shows a matrix for illustrating the signal detecting method according to a fourth embodiment of the present invention.

FIG. 23 shows a matrix for reading the optical disc 1 shown in FIG. 4, using the push-pull signal as an RF signal and the sum signal as an auxiliary signal. In FIG. 23, the sign of the push-pull and the signal level of the sum signal are plotted on the row and column, respectively. If, in FIG. 23, the sum signal is H and the sign of the push-pull signal is "+" or "−", while there is no pit in the spot of the detector 25 shown in FIG. 20 or the pits are in the state shown at 7 in FIG. 20, the push-pull signal cannot be produced, so that the push-pull signal cannot assume the state of "+" or "−". Consequently, the state in which the sum signal is H and the push-pull signal has the sign of "+" or "−" cannot exist.

On the other hand, if the sum signal is H and the push-pull signal is "0", the pit necessarily exists within the light spot in one of the light-receiving regions 251, 252, in which case the push-pull signal is necessarily produced and hence the state in which the push-pull signal is "0" can never occur so that the state in which the sum signal is H and the push-pull signal is "0" cannot exist.

If the sum signal is L and the push-pull signal is "+" or "−", pits are present in both light spots of the first and second light-receiving regions 251, 252 in which case no push-pull signal is produced. Therefore, the state in which the sum signal is L and the push-pull signal is "+" or "−", the pits are present in both light spots in the first and second light-receiving regions 251, 252 of the detector 25, in which case no push-pull signal is produced. Consequently, the state in which the sum signal is L and the push-pull signal is "+" or "−" cannot exist.

Thus the information recorded on the optical disc 1 may be read and discriminated on the basis of four states, namely the states in which the sum signal is M and the push-pull signal is "+", the sum signal is H or L and the push-pull signal is "0" and the sum signal is M and the push-pull signal is "−", as indicated by 0 in FIG. 23. Meanwhile, with the fourth embodiment, since the push-pull signal is treated as an RF signal, the above states may be deeded to be the three states, namely the states in which the push-pull signal is "+" and the sum signal is M, the push-pull signal is "−" and the sum signal is M. Consequently, three-valued detection may be achieved in the similar manner to the first embodiment.

Preferably, output signals of the first and second light-receiving areas 251, 252 of the detector 25 are supplied via the first and second equalizers 201, 202 to the subtraction circuit 206 and to the addition circuit 237 and the sum signals and the push-pull signals produced by these circuits 206, 207 are supplied to the signal discriminating circuit of the first embodiment where a matrix is taken of the push-pull signal as the RF signal and the sum signal as an auxiliary signal to read out the information recorded on the optical disc 1.

What is claimed is:

1. An apparatus for reproducing data recorded on an optical recording medium, wherein data recorded on a succeeding track of the optical recording medium is generated by logical processing of input data with data recorded on a preceding recording track of the optical recording medium, comprising:

an optical head;

said optical head having a light source, an objective lens for converging a light beam radiated from said light source simultaneously over both the succeeding track and the preceding track of the optical recording medium, and light receiving means for receiving a return light beam incident thereon from said optical recording medium via said objective lens and in response to said return light beam, generating a plurality of output signals;

a plurality of differential amplifiers operative to generate differences between the plurality of output signals;

a discriminating circuit for discriminating recorded data based upon the differences between the plurality of output signals, the signal discriminating circuit operative to perform logical processing of the differences between the plurality of output signals, the logical processing of the differences between the plurality of output signals corresponding to the logical processing of the input data with the data recorded on the preceding recording track of the optical recording medium.

2. The apparatus of claim 1, wherein said apparatus further comprises:

clock extracting means for extracting clock signal components from said plurality of output signals of said light receiving means; and control means for controlling the operation of said discriminating circuit based upon said clock signals produced by said clock extracting means.

3. The apparatus of claim 1, wherein said light receiving means has at least two light receiving areas having a boundary line parallel to said recording tracks and wherein said discriminating circuit further comprises:

a plurality of comparators operative to compare the differences between the plurality of output signals prior to the logical processing of the differences between the plurality of output signals.

4. The apparatus of claim 1, wherein said light receiving means comprises:

at least two light receiving sections having a boundary line parallel to said recording tracks.

5. The apparatus of claim 4, wherein said discriminating circuit comprises:

means for generating a sum signal of the plurality of output signals; and means for generating a reproduced signal corresponding to the recorded data being read based upon differences between said sum signal and the plurality of output signals.

6. A method for reproducing data recorded on an optical recording medium wherein an n-th recording track is located at a distance from an (n−1)th recording track preceding said n-th recording track in a recording region which is narrower than the diameter of a spot of a light beam radiated on the recording area, data recorded on the n-th track generated by logical processing of input data with data recorded on the (n-1)th recording track, comprising the steps of:

receiving, with a detector having first and second light receiving sections having a boundary line extending parallel to a recording track of the optical recording medium, a return beam of a light beam radiated across two adjacent recording tracks on said optical recording medium and, in response thereto, generating output signals from said first and second light receiving sections;

generating a plurality of differential signals based Upon the output signals of said first light receiving section and said second light receiving section; and logical processing of at least two of the differential signals, the logical processing of the differential signals corresponding to the logical processing of the input data with the data recorded on the (n-1)th recording track.

7. The method of claim 6, further comprising the steps of:

generating a sum signal of output signals of said first and second light receiving sections; and generating a reproduced signal corresponding to the recorded data being read based upon differences between said sum signal and the output signals of the first and second light receiving sections.

8. A method for reproducing data recorded on an optical recording medium, wherein data recorded on a succeeding track of the optical recording medium is generated by logical processing of input data with data recorded on a preceding recording track of the optical recording medium, comprising the steps of:

converging a light beam radiated from a light source simultaneously over both the succeeding track and the preceding track of the optical recording medium;

receiving a return light beam incident thereon from said optical recording medium;

generating a plurality of output signals in response to said return light beam;

generating differences between the plurality of output signals;

discriminating recorded data based upon the differences between the plurality of output signals, the discriminating including logical processing of the differences between the plurality of output signals, the logical processing of the differences between the plurality of output signals corresponding to the logical processing of the input data with the data recorded on the preceding recording track of the optical recording medium.

9. The method of claim 8, further comprising the steps of:

extracting clock signal components from said plurality of output signals; and controlling the discriminating based upon said clock signals.

10. The method of claim 8, wherein said return light beam is received in at least two light receiving areas having a boundary line parallel to said recording tracks, and wherein the step of discriminating further comprises the step of:

comparing the differences between the plurality of output signals prior to the logical processing of the differences between the plurality of output signals.

11. The method of claim 8, wherein said return light beam is received in at least two light receiving areas having a boundary line parallel to said recording tracks.

12. The method of claim 11, wherein said step of discriminating comprises the steps of:

generating a sum signal of the plurality of output signals; and generating a reproduced signal corresponding to the recorded data being read based on differences between said sum signal and the plurality of output signals.

* * * * *